United States Patent
Melloni et al.

(10) Patent No.: US 9,722,124 B2
(45) Date of Patent: Aug. 1, 2017

(54) OPTICAL RADIATION DETECTION SYSTEM COMPRISING AN ELECTRIC PARAMETER MEASURING CIRCUIT

(71) Applicant: Politecnico di Milano, Milan (IT)

(72) Inventors: Andrea Melloni, Milan (IT); Marco Sampietro, Como (IT); Stefano Grillanda, Cernusco sul Naviglio (IT); Francesco Morichetti, Novara (IT); Marco Carminati, Milan (IT); Giorgio Ferrari, Somma Lombardo (IT)

(73) Assignee: Politecnico di Milano, Milan (IT)

( * ) Notice: Subject to any disclaimer, the term of this patent is extended or adjusted under 35 U.S.C. 154(b) by 228 days.

(21) Appl. No.: 14/650,969

(22) PCT Filed: Dec. 23, 2013

(86) PCT No.: PCT/EP2013/077918
§ 371 (c)(1),
(2) Date: Jun. 10, 2015

(87) PCT Pub. No.: WO2014/096449
PCT Pub. Date: Jun. 26, 2014

(65) Prior Publication Data
US 2016/0359074 A1    Dec. 8, 2016

(30) Foreign Application Priority Data

Dec. 21, 2012 (IT) .............. MI2012A2216

(51) Int. Cl.
*H01L 31/08* (2006.01)
*H01L 31/0232* (2014.01)
*G02B 6/12* (2006.01)

(52) U.S. Cl.
CPC .............. *H01L 31/08* (2013.01); *G02B 6/12* (2013.01); *H01L 31/02325* (2013.01);
(Continued)

(58) Field of Classification Search
CPC ........... G02B 2006/12061; G02B 2006/12097; G02B 2006/121; G02B 2006/12138;
(Continued)

(56) References Cited

U.S. PATENT DOCUMENTS 5,054,871 A    10/1991  Deri
7,792,393 B2    9/2010  Hochberg et al.
(Continued)

FOREIGN PATENT DOCUMENTS

| | | |
|---|---|---|
| EP | 0703476 A2 | 3/1996 |
| WO | 03075362 A2 | 9/2003 |
| WO | 2007113502 A1 | 10/2007 |

OTHER PUBLICATIONS

Kyle Preston et al.: "Waveguide-integrated telcom-wavelength photodiode in deposited silicon", Optices Letter, Optical Socitey of America, US, vol. 36, No. 1, Jan. 1, 2011, pp. 52-54.
(Continued)

*Primary Examiner* — Francis M Legasse, Jr.
(74) *Attorney, Agent, or Firm* — Manelli Selter PLLC; Edward J. Stemberger

(57) ABSTRACT

An optical radiation detection system (100) comprising: an optical medium (1) structured to define a region (5) suitable for transmitting an optical radiation and being associated to at least one electric parameter varying as a function of the optical radiation concerning said region; at least one electrode (2, 3) electrically coupled to the optical medium (1), and spaced from said region (5), an electric power generator (4) connected to said at least one electrode (2) and structured to provide an electric signal (Se) to be applied to the optical medium. Further, the system comprises an electric measuring circuit (50) connected to said at least one electrode (2)
(Continued)

and structured to provide a measuring electric signal (SM) representing a variation of said at least one electric parameter.

11 Claims, 11 Drawing Sheets

(52) U.S. Cl.
CPC .............. *G02B 2006/121* (2013.01); *G02B 2006/12061* (2013.01); *G02B 2006/12097* (2013.01); *G02B 2006/12138* (2013.01); *G02B 2006/12159* (2013.01)

(58) Field of Classification Search
CPC ............ G02B 2006/12159; G02B 6/12; H01L 31/02325; H01L 31/08
See application file for complete search history.

(56) References Cited

U.S. PATENT DOCUMENTS

| | | |
|---|---|---|
| 2003/0213895 A1 | 11/2003 | Duer |
| 2006/0186503 A1 | 8/2006 | Guidotti |
| 2007/0189688 A1 | 8/2007 | Dehlinger et al. |
| 2009/0052830 A1 | 2/2009 | Hochberg et al. |
| 2009/0152664 A1* | 6/2009 | Klem ................ H01L 27/14603 257/440 |
| 2010/0166364 A1 | 7/2010 | Abad et al. |

OTHER PUBLICATIONS

A.P. Knights et al.: "Monolithically integrated photodetectors for optical signal monitoring in silicon waveguides/ title", Proceedings of SPIE, vol. 6125 Feb. 9, 2006, p. 61250J.

Bradley J. et al.: "Silicon waveguide-integrated optical power monititor with enhanced sensitivity at 1550nm", Applied Physics Letters, AIP Americal Institute of Physics, Melville, NY, US, vol. 86, No. 24, Jun. 7, 2005, pp. 241103-241103.

International Search Report & Written Opinion in PCT/EP2013/077918 dated Mar. 6, 2014.

Geis et al., "CMOS-Compatible All-Si High-Speed Waveguide Photodiodes with High Responsivity in Near-Infrared Communication Band", Photonics Technology Letters, IEEE, vol. 19, No. 3, pp. 152-154, Feb. 1, 2007.

Kumar et al., "Power monitoring in dielectric-loaded surface plasmon-polariton waveguides", Optics Express, vol. 19, No. 4, pp. 2972-2978, Feb. 14, 2011.

Gumennk et al., "All-in-Fiber Chemical Sensing", Advanced Materials, www.advmat.de, 2012.

* cited by examiner a)            b)

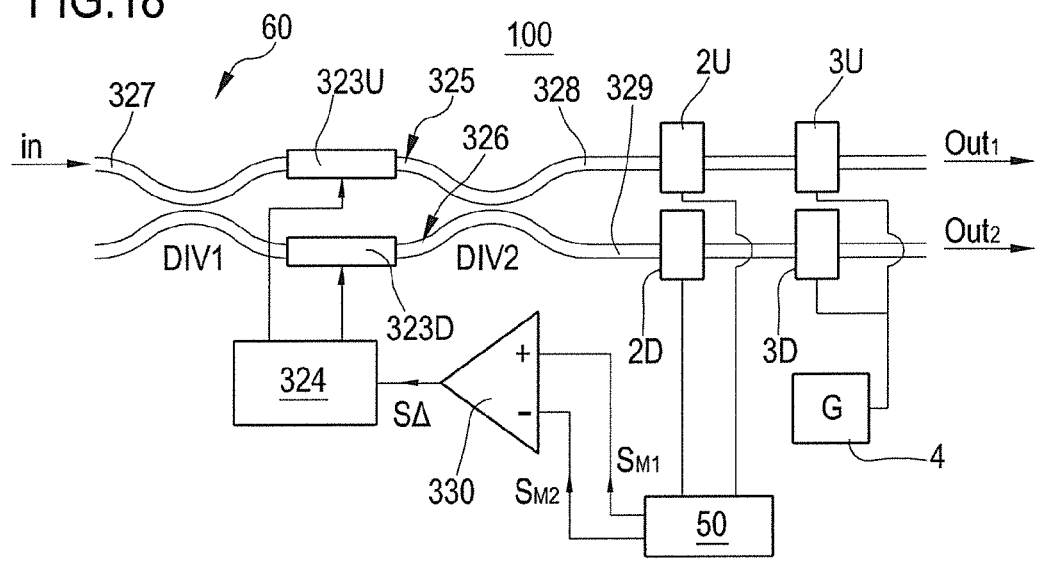
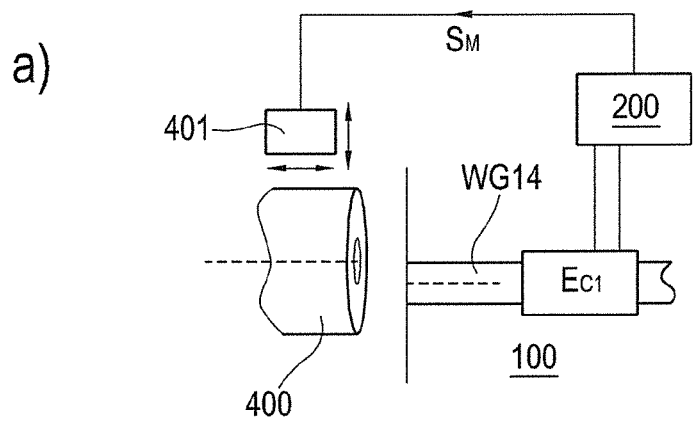
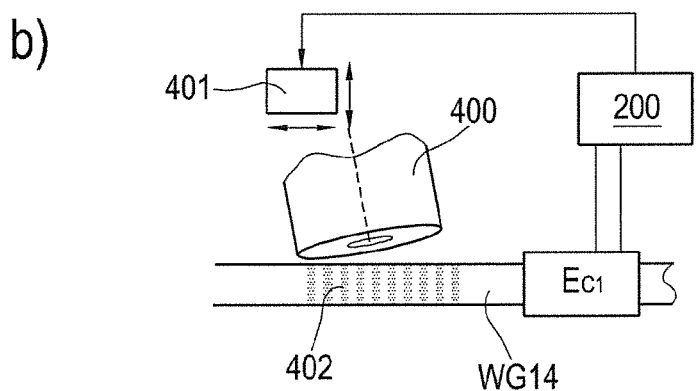
FIG. 19

OPTICAL RADIATION DETECTION SYSTEM COMPRISING AN ELECTRIC PARAMETER MEASURING CIRCUIT

FIELD OF THE INVENTION

The present description refers to a technique for monitoring or detecting the condition of an optical medium such as, for example, an optical component or circuit.

PRIOR ART

Several devices useable for detecting or monitoring the condition of an optical medium based on the conversion of an optical radiation into an electrical signal are known.

M. W. Geis, et al., "CMOS-Compatible All-Si High-Speed Waveguide Photodiodes With High Responsivity in Near-Infrared Communication Band," Photonics Technology Letters, IEEE, Vol. 19, no. 3, pp. 152-154, Feb. 1, 2007, (http://dx.doi.org/10.1109/LPT.2006.890109) describes a photodiode for silicon optical circuits, having the object of converting light in electric current.

A. Kumar at al., "Power monitoring in dielectric-loaded surface plasmon-polariton waveguides", Opt. Express 19, 2972-2978, 2011 (http://www.opticsinfobase.org/oe/abstract.cfm?URI=oe-19-4-2972) describes a device for monitoring a light intensity in a plasmonic waveguide. Such device has been specifically designed for plasmonic waveguides and exploits the heating of a metal due to a light absorption.

Document U.S. Pat. No. 7,792,393 describes a photo detector provided with a metal electrode directly positioned on the core of a silicon waveguide for increasing the optical power amount absorbed and converted into an electric form.

Document US-2007-A-189688 shows a photo detector which derives an optical signal for converting it in an electric form, which comprises two layers: a light guiding layer and a second light absorbing layer.

Document US-2010-0166364 relates to a photo detector exclusively based on the two-photon absorption (TPA) effect and which derives an amount greater than 15% of the power of light present inside a waveguide.

Document US-2003-A-213895 describes a technique for monitoring the performance and optical power of a chip using a photodiode mounted on the chip itself in order to partially intercept the light exiting a waveguide due to radiation or diffusion effects.

These conventional techniques have the disadvantage of deriving a part of an optical radiation from the optical medium to be monitored, so that a disturbance of the behavior and performance of the medium itself is introduced.

A. Gumennik "All-in-Fiber Chemical Sensing" Advanced Materials, 2012 (http://onlinelibrary.wiley.com/doi/10.1002/adma.201203053/abstract) describes a device, wherein the presence of a light radiation is detected by an impedance variation induced in an absorbing medium. The device has been designed for absorbing a light radiation (in this particular case irradiated "in loco" by a chemical reaction), by inducing a strong disturbance in the radiation itself. Particularly, it is added to the optical fiber a chalcogenide material layer strongly absorbing the wavelengths of interest and a variation of the electrical parameters of this material following such absorption has been observed.

Document "Silicon waveguide-integrated optical power monitor enhanced sensitivity at 1550 nm", Bradley J. et al. Applied Physics Letters, AIP. Melville, N.Y., US; vol. 86, no. 24, 7 June 205, pages 241103/1-241103/3 describes an optical power monitor integrated with a silicon-on-insulator rib waveguide showing metal contacts (Al) electrically connected to respective doped regions.

SUMMARY

The Applicant has coped with the problem of providing a technique for detecting an optical radiation in an optical transmissive medium which causes a disturbance of the radiation in the optical medium which is smaller than what occurs in devices implemented according to conventional techniques, or which is completely negligible.

An approach to the above mentioned problem is offered by an optical radiation system as described in claim 1 and by its specific embodiments described in independent claims.

BRIEF DESCRIPTION OF THE DRAWINGS

In the following some embodiments will be described in an exemplifying and non limiting way with reference to the attached drawings, wherein:

FIG. 11($b$) shows a longitudinal section of the waveguide of FIG. 11($a$), overlapped on its electric equivalent circuit;

FIG. 12($b$) shows two curves each indicative of a measurement of the ratio of the optical signal power of the disturbance induced by the detecting system to the continuous optical radiation power, for two optical power levels in the waveguide;

FIG. 13(b) shows a curve representative of the conductance variation in the waveguide of FIG. 13(a) as a function of a local optical power;

FIG. 18 shows another example of the optical radiation detecting system comprising a Mach-Zehnder interferometer;

FIG. 19(a) shows a further example of said detecting system structured for optically coupling an optical fiber to an input port of a waveguide;

FIG. 19(b) shows another example of said detecting system structured to optically couple an optical fiber and a waveguide by the use of a coupling grating;

DETAILED DESCRIPTION

Figure 1:
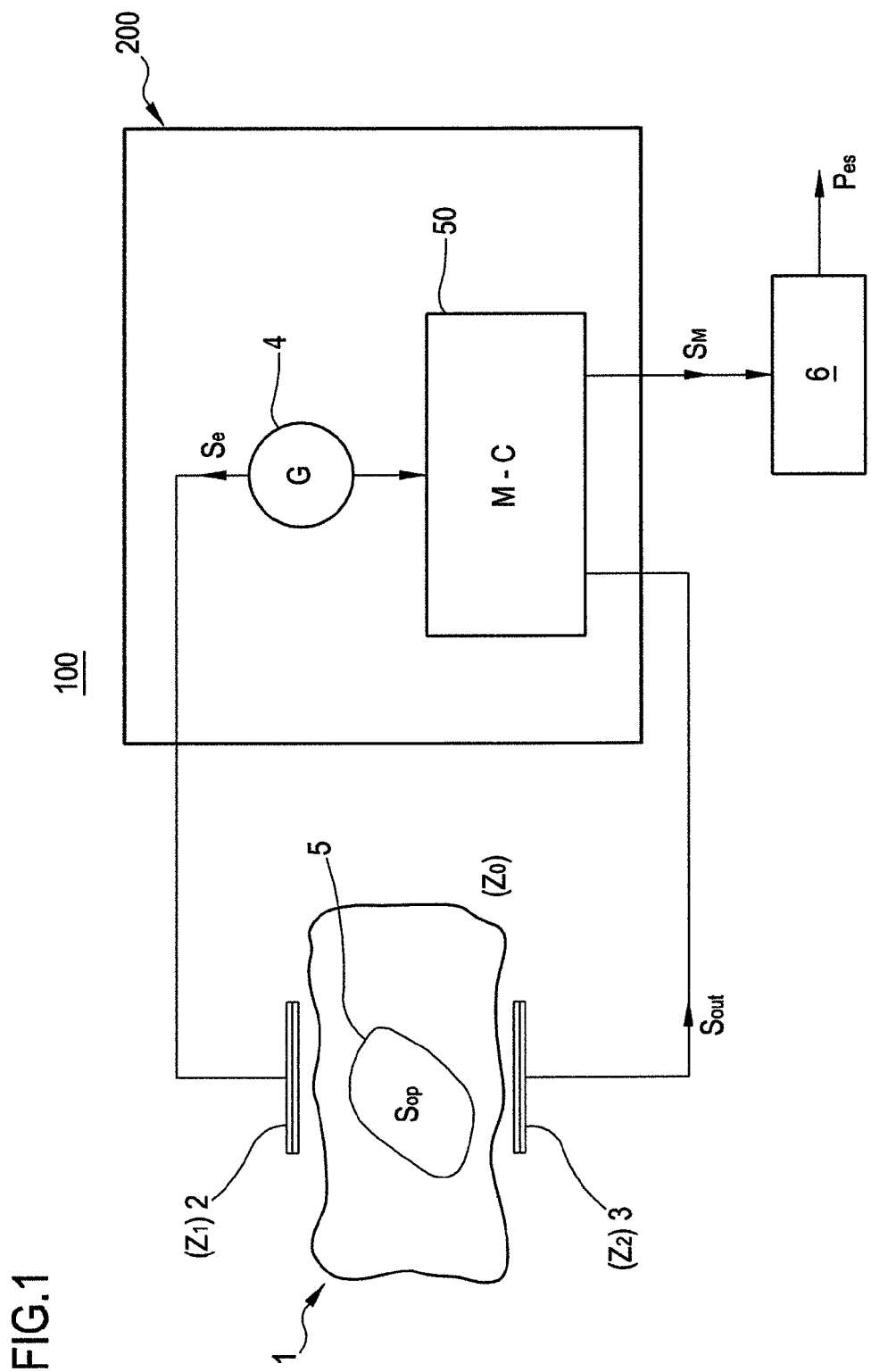
FIG. 1 shows a first embodiment of an optical radiation detecting system comprising an optical medium.

FIG. 1 schematically shows a first example of an optical radiation detecting system 100 comprising an optical medium 1, at least one first electrode 2 and an electric probe block 200, in turn comprising an electric power generator 4 (G) and an electric measuring circuit 50 (M-C).

More specifically, optical medium 1 comprises an optical region 5 suitable for transmitting an optical radiation $S_{op}$ and such to present at least one electric parameter varying as a function of an optical radiation passing through it. Optical radiation $S_{op}$ comprises a radiation at the optical frequencies, and particularly the medium-, near-infrared and visible wavelengths, that is wavelengths between 10 μm and 300 nm. Moreover, it is understood that the optical radiation $S_{op}$ comprises also a radiation having a wavelength comprised between 10 μm and 100 μm, and the ultraviolet radiation UV having a wavelength comprised between 100 nm and 300 nm.

An optical medium, or a region of such optical medium, can be defined as "transmissive" or in other words "suitable for transmitting an optical radiation" if its transmission coefficient, that is the ratio of an output optical radiation power $P_{out}$ from the optical medium to the input optical radiation power $P_{in}$ to the optical medium, is greater than 0.5, preferably greater than 0.8, more preferably greater than 0.9, and still more preferably greater than 0.95.

It is observed that the above mentioned transmission coefficient values do not necessarily refer to the whole indicated frequency spectrum for defining the optical radiation $S_{op}$, but they can also refer just to a portion of such spectrum.

Moreover, as better explained after, such transmission coefficient has been evaluated by considering the powers $P_{in}$ and $P_{out}$ respectively present at an input port and output port of region 5 or optical medium 1, determined at said at least one first electrode 2.

The transmissive-type optical medium 1 is, for example, a waveguide such as an optical fiber, an integrated waveguide or another type of integrated optical component. Particularly, optical medium 1 comprises an integrated waveguide, which can be for example, a ridge-type or rib-type waveguide. According to further examples, optical medium 1 includes guides made by photonic crystal technologies, guides obtained by diffusion processes (for example titanium diffused in a lithium niobite crystal), slot guides.

With reference to possible materials for implementing the optical medium 1, possible implementations comprise semiconductor materials, such as for example a silicon-on-insulator technology platform or an indium phosphide technology platform. Further possible materials comprise, for example, lithium niobate, amorphous silicon, AlGaAS and combinations thereof with other materials, specifically those of group III-V (for example, InP), germanium and combinations thereof with other materials, specifically those of group IV (for example Si).

In the following, examples of embodiment according to some of the above mentioned technologies will be described.

With reference to the electric parameter of optical medium 1, which is a function of the optical radiation, such parameter can be one or more of the following electric quantities: the impedance of the optical medium 1 and, particularly, its resistance and/or capacitance. Further, such electric parameter can be also the electric voltage (measured by applying current) and/or electric current (measured by applying a voltage) which optical medium 1 is subjected to.

First electrode 2 is electrically coupled to optical medium 1, and is spaced at a distance from the region 5 in order to not perturbate the optical radiation passing through the optical medium 1 or in order to perturbate it in a negligible way. Optical radiation detecting system 100 can also comprise at least one second electrode 3 which is also electrically coupled to the optical medium 1 and is arranged at a distance from region 5 in order to not perturbate the optical radiation passing through the optical medium 1, or in order to perturbate it is a negligible way.

Particularly, first electrode 2 and second electrode 3 are positioned in contact with optical medium 1, but at a relative distance from the region 5 subjected to the optical radiation so that the electric field, associated to the optical radiation, is negligible.

For example, with reference to metal electrodes or made of other materials which can have an effect perturbating the optical field, distance d of first electrode 2 to a zone of region 5, where the intensity of the optical radiation electric field is maximum, is selected so that in the zone in which first electrode 2 is positioned, the field E(d) (smaller than the maximum field $E_0$) satisfies the following relations expressed in decibel:

$$R=|E_0/E(d)|^2>10 \text{ dB},$$

preferably, R is greater than 20 dB, more preferably R is greater than 30 dB, and still more preferably R is greater than 40 dB.

At least one of first and second electrodes 2 and 3 can be a metal element or can be made of other conductive materials such as, for example, polysilicon, eventually p- or n-doped. Moreover, one or both of first and second electrodes 2 and 3 can coincide with a structural portion of optical medium 1, as it will be exemplifyingly described in the following.

According to further embodiments, first 2 and/or second electrodes 3 can be made of electrically conductive materials, but optically transparent, such as ITO (titanium oxide and indium oxide) and AZO (zinc oxide and aluminum oxide), or alternatively of strongly doped semiconductors (particularly silicon and InP). Optically transparent materials ensure a smaller disturbance in the electric field inside region 5, and for them it can be adopted a distance d from region 5 smaller than the one obtainable based on the above given relations regarding the ratio $R|E_0/E(d)|^2$.

It is observed that region 5 satisfies the values indicated in the ratio of the output electric power $P_{out}$ to the input electric power $P_{in}$ by considering as input and output ports, where these powers are evaluated, two opposed end cross-sections of region 5 of which it is intended to measure its electric parameter. Particularly, input and output ports can be defined at the beginning and at the end of electrode 2, in the propagation direction of optical radiation.

In case are used both first electrode 2 and second electrode 3, input and output ports can be defined at a first cross-section proximate to a starting end of first electrode 2 and at a second cross-section proximate to a final end of second electrode 3, in the propagation direction of optical radiation.

It is also observed that the electrical coupling of first electrode 2 and second electrode 3 with optical medium 1 can be, particularly, of capacitive and/or resistive type, and therefore can be schematically represented by a relative access impedance. Particularly, the electric coupling between first electrode 2 and optical medium 1 is schematically represented by a first access impedance $Z_1$, while electric coupling between second electrode 3 and optical medium 1 can be schematically represented by a second access impedance $Z_2$. Values of first and second impedances $Z_1$, $Z_2$ are known because they were determined in the project step. As an example, the first electrode 2 can be of the capacitive type and the and second electrode 3 can be of the resistive type, or viceversa. Electric power generator 4 is, for example, connected to first electrode 2 and is structured to supply a voltage or current electric signal $S_e$, DC or AC. Particularly, when first and second electrodes 2, 3 form a capacitive coupling, generator 4 generates a AC signal $S_e$, while when they form a resistive coupling, signal $S_e$ can be DC.

The amplitude of electric signal $S_e$ is such to substantially avoid any undesired effect of the optical properties of the optical medium 1 such as, for example, one of the following effects: an electro-optic effect, a Kerr effect, an electrostriction effect, a piezoelectric effect, a thermal effect, injection/removal of electric carriers, and an acoustic-optical effect.

Electric measuring circuit 50 connected, according to the example in FIG. 1, to second electrode 3, is structured to supply an electric measuring signal $S_e$ representative of a variation of said electrical parameter of optical medium 1. Particularly, electric measuring circuit 50 is capable of measuring a variation of an electric impedance $Z_0$ associated to optical medium 1. Such electric impedance $Z_0$ variation measurement can be also indirectly obtained, that is by a measurement of the current or voltage variations which optical medium 1 is subjected to.

Electric measuring circuit 50 can be such to implement any impedance measuring technique such as for example: a technique based on the sinusoidal excitation of first electrode 2 (at a single frequency or at more frequencies), a technique exploiting a current sensing coupled to a synchronous detection (lock-in), techniques based on bridge circuits, half-bridge circuits (for example, in the raziometric splitter configuration), techniques based on full-bridge circuits (for example, Wheatstone bridge), and also techniques based on the Fourier FFT (Fast Fourier Transform), Fourier Transform, and resonating techniques.

Electric measuring circuit 50 can be also configured to implement measuring techniques in the time domain (based on an analysis of a response from the optical medium 1 to a stimulation signal $S_e$ different from a sinusoid, such as step, pulse, or square wave signals). It is observed that the time domain measuring techniques enable to use substantially simple conditioning circuits.

Electric measuring circuit 50 can be implemented, for example, by both commercially available discrete components and dedicated integrated circuits (ASIC), specifically manufactured by a standard CMOS technology.

Optical radiation detecting system 100 can also comprise a computing module 6 (for example a processor provided with an associated software) capable of associating, with a calibration step, a measured variation of electric parameter (such as impedance $Z_0$) to a value of the variation of the power of the optical radiation which the optical medium 1 is subjected to.

This calibration can be performed based on a predetermined association function (for example, schematically represented by a table of values) experimentally obtained after a characterization of the optical medium 1.

Figure 2:
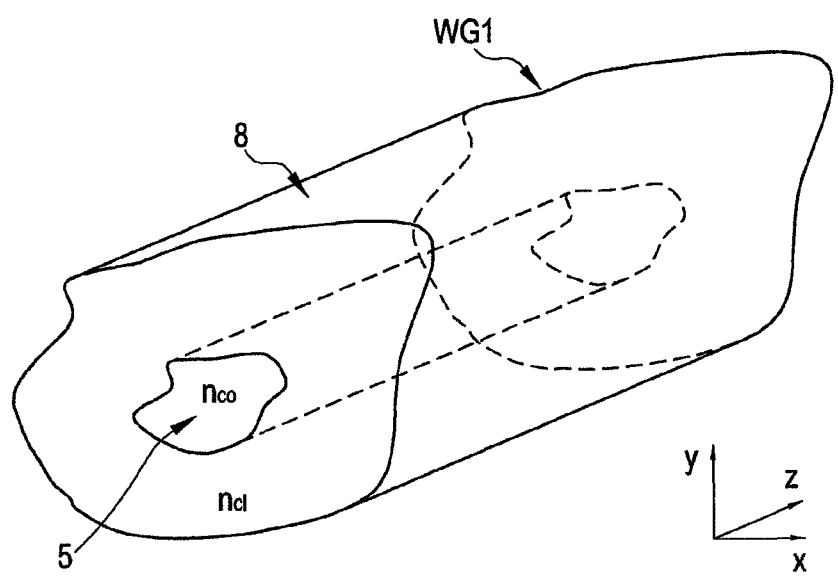
FIG. 2 shows a perspective view of an optical waveguide useable in said system.

A first example of optical medium 1 is shown in FIG. 2, which illustrates a first optical waveguide WG1.

First optical waveguide WG1 comprises an inner region 5 made of a material having a high refraction index $n_{co}$, generally known as core region, surrounded by an outer region 8 made of a material having a lower fraction index ($n_{cl}$), generally known as cladding. In such structure, the electromagnetic field associated to optical radiation is mainly confined in the core region 5, and light propagates along the longitudinal axis z of first waveguide WG1, while the propagation in the transversal plane xy is mainly inhibited.

Core region 5 can be made of an homogeneous material having a single refraction index $n_{co}$ or can be made of different materials having a plurality of different refraction indexes $n_{co1}$, $n_{co2}$, $n_{co2}$, . . . .

Analogously, cladding region 8 can be made both of a single homogeneous material having a single refraction index $n_{cl}$, and of a group of materials having different indexes $n_{cl1}$, $n_{cl2}$, $n_{cl2}$, . . . .

Materials both of the core 5 and cladding region 8 have preferably a high transparency to the frequency of the light radiation. According to the difference of the refraction index (defined analogously as $\Delta n = (n_{co} - n_{cl})/n_{cl}$) of core region 5, and of the light radiation frequency, first waveguide WG1 can support the light propagation in one or more propagation modes. First waveguide WG1 can be single mode or multimode with an arbitrary number of modes and for each state of the radiation polarization.

Figures 3, 4:
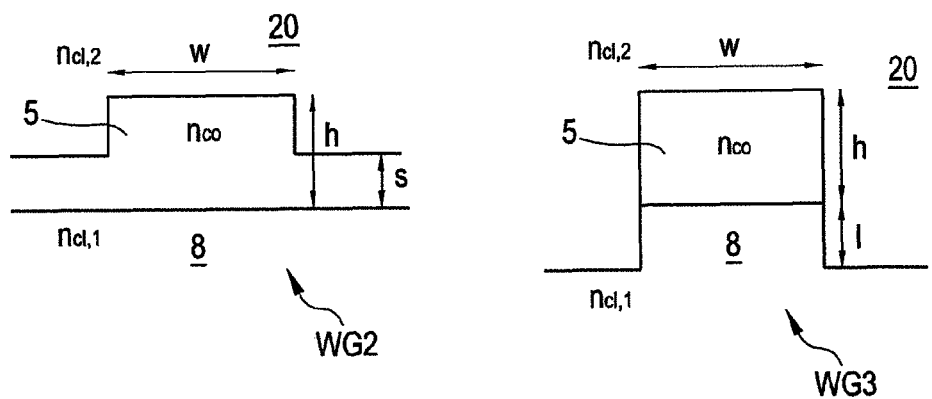
FIG. 3 shows a cross-section of an example of a ridge-type optical waveguide.
FIG. 4 shows a cross-section of an example of a rib-type optical waveguide.

FIGS. 3 and 4 respectively show a second and third examples of the optical medium 1 such as: a second integrated waveguide WG2 of the ridge-type (FIG. 3), and a third integrated optical waveguide WG3 of the rib-type (FIG. 4).

In FIG. 3, second waveguide WG2 comprises a layer of core material 5, having a refraction index $n_{co}$ and height h, made on a first layer 8 having a refraction index $n_{cl1}$, forming the lower cladding. The layer of the core material 5 is covered by an upper cladding material 20, having a refraction index $n_{cl2}$, which forms the upper cladding.

Lower cladding 8 and upper cladding 20 can be made of the same or different materials. For example, air can be used as a material both for lower cladding 8 and upper cladding 20. Core material 5 has a central region having a width w and height h and side regions having thickness s less than h.

Core 5 of third waveguide WG3, shown in FIG. 4, has a rectangular cross-section with dimensions w×h, positioned on a lower cladding 8 forming a raised region having width w and thickness e. Also in this configuration, lower 8 and upper cladding regions 20 can be made with the same or different materials.

With reference to the operation of detecting system 100 using, for example, first waveguide WG1 as optical medium 1, it is observed that when optical radiation $S_{op}$ passes through first waveguide WG1, different physical mechanisms can cause a variation of the electric parameter of the guide in order to detect the presence of the radiation itself. Some of these mechanisms are:

- thermal heating, caused by the absorption of the optical region in first waveguide WG1;
- generation of carriers (electron-hole pairs) induced by the presence of the optical radiation;
- electrostriction, in other words, a variation in the density of regions of first waveguide WG1 under the effect of an optical field;
- variation of the mobility of the free carriers present in the material due to the effect of the radiation pressure and/or electrostriction induced by the presence of the optical field.

Same considerations are true for other possible types of the optical medium 1, such as for example, the second waveguide WG2 or third waveguide WG3.

Electric power generator 4 supplies the electric signal $S_e$ to first electrode 2. First waveguide WG1 is positioned in the electric circuit comprising the electric power generator 4 and measuring circuit 50.

As the optical radiation characteristics vary, for example its power, there is a corresponding variation of the electric parameter associated to first waveguide WG1, such as for example, the electric impedance $Z_0$ associated to core 5.

Measuring circuit 50 receives by second electrode 3 an output electric signal $S_{out}$ (an electric voltage and/or current) which depends on the value taken by electric impedance $Z_0$ associated to first waveguide WG1 and based on this output signal $S_{out}$/supplies the measuring signal $S_M$ representative of a measurement of a present value of electric impedance $Z_0$.

Moreover, measuring circuit 50 (or computing module 6) compares the present value of electrical impedance $Z_0$ with a value of the same magnitude previously measured, and therefore detects a possible variation in electric impedance $Z_0$.

Computing module 6 associates this measured variation of electric impedance $Z_0$ to a corresponding optical power variation of the optical radiation passing through the first waveguide WG1, giving therefore back an estimated value $P_{op}$ representative of the optical absolute power or of the optical power variation inside first waveguide WG1.

Figure 5:
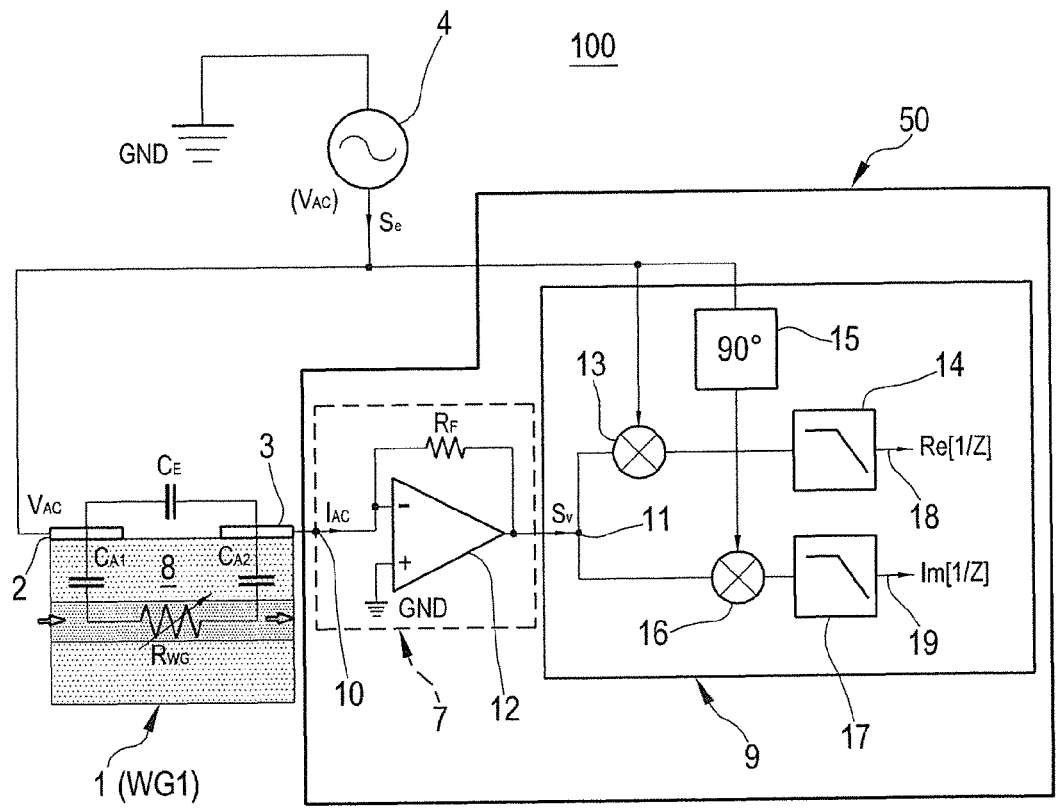
FIG. 5 shows a specific embodiment of the detecting system of FIG. 1, using a measuring circuit structured according to the current sensing technique coupled to a synchronous detection (lock-in)

FIG. 5 shows a particular embodiment of optical system 100, using a measuring circuit 50 configured according to a current sensing technique, coupled to the synchronous detection (lock-in). Moreover, FIG. 5 shows a possible equivalent electric diagram of the above described detecting system 100.

According to this example, electric power generator 4 is such to generate an electric signal $S_e$ as a sinusoidal electric voltage $V_{AC}$ having frequency $f_0$. In the diagram of FIG. 5, first electrode 2 and second electrode 3 are electrically equivalent to corresponding conductive electrical terminals.

Between first 2 and second electrodes 3 it is present, in this example, an electrodes capacitance $C_E$ corresponding to a parasitic capacitance acting between first and second electrodes 2, 3.

Moreover, a first capacitive-type access impedance $Z_1$, corresponding to a first access capacitance $C_{A1}$, is associated to first electrode 2. Such first access capacitance $C_{A1}$ refers to the presence of a coupling capacitance acting, for example, between first electrode 2 and region 5 subjected to the optical radiation.

A second capacitive-type access impedance $Z_2$, corresponding to a second access capacitance $C_{A2}$, is for example associated to second electrode 3. Such second access capacitance $C_{A2}$ refers to the presence of a corresponding coupling capacitance acting, for example, between second electrode 3 and region 5 subjected to the optical radiation.

For example, when the optical medium 1 is an integrated optical waveguide made of a semiconductor material, such as silicon, region 5 corresponds to the waveguide core which is surrounded by a cladding made of silicon oxide 8 (and 20). In such case, first access capacitance $C_{A1}$ corresponds to a capacitance, according to such capacitance, cladding 8 acts as a dielectric positioned between first electrode 2 and the core 5. Analogously, second access capacitance $C_{A2}$ corresponds to a capacitance, according to such capacitance cladding 8 acts as a dielectric positioned between second electrode 3 and silicon core 5.

To silicon core 5 corresponds a resistor of resistance $R_{WG}$ which is connected across those terminals of first and second access capacitance $C_{A1}$ and $C_{A2}$ which are not connected to first and second electrodes 2, 3. The values of first access capacitance $C_{A1}$, second access capacitance $C_{A2}$ are project parameters which are determined in the device optimization step while parasitic capacitance across electrodes $C_E$, whose presence is not desired but unavoidable, must be minimized always in the project step.

Core 5 of first waveguide WG1, corresponding to optical medium 1, has an electric resistance $R_{WG}$ which is a function of the optical radiation passing through core 5 itself.

Measuring circuit 50, as shown in FIG. 5, comprises a current-voltage converter 7 and a lock-in demodulator 9. Current-voltage converter 7 is provided with a first input terminal 10 connected to second electrode 3 for receiving an alternate current $I_{AC}$. A first output terminal 11 of current-voltage converter 7 is connected to a second input terminal of the lock-in demodulator 9. Current-voltage converter 7 is structured to supply at first output terminal 11 a voltage electric signal $S_V$.

Preferably, current-voltage converter 7 comprises a transimpedance amplifier 12 obtainable, for example, by an operational amplifier having a non inverting input connected to a ground terminal GND, and an inverting input connected to the first input terminal 10. First output terminal 11 is connected to the operational amplifier 12 inverting terminal by a feedback resistance $R_F$, for example equal to 10 kΩ. Transimpedance amplifier 7 has a bandwidth greater than (at least by a factor 10) frequency $f_0$ of the sinusoidal voltage $V_{AC}$, in order to avoid inaccuracies (an amplitude attenuation and phase shift).

According to an example, lock-in demodulator 9 comprises a first demodulator including a first multiplier 13 and a first low pass filter 14.

First multiplier 13 is configured to multiply the electric signal $S_e$ by the voltage electric signal $S_V$ present at first output terminal 11. Further, measuring circuit 50 is provided with a second demodulator including a phase shifter 15, second multiplier 16 and second low pass filter 17.

Second multiplier 16 is configured to multiply a 90° shifted version, supplied by phase shifter 15, of the electric signal $S_e$ by the voltage electric signal $S_V$ present at first output terminal 11.

During the operation, first electrode 2 is excited by sinusoidal voltage $V_{AC}$ at frequency $f_0$, while alternate current $I_{AC}$ flowing to second electrode 3, is converted in the voltage electric signal $S_V$ by the transimpedance amplifier 7. This voltage electric signal $S_V$ is therefore demodulated by the lock-in demodulator 9.

More particularly, voltage electric signal $S_V$ is multiplied by first multiplier 13 with the sinusoidal voltage $V_{AC}$, and is multiplied by second multiplier 16 with the quadrature version of sinusoidal voltage $V_{AC}$.

Second low pass filter 17 filters the signal exiting second multiplier 16 and at an output port 19, supplies the imaginary part of the voltage electric signal $S_V$ corresponding to the imaginary part of the reciprocal of the complex impedance $Im[1/Z]$, wherein Z is the total impedance in the considered part of first waveguide WG1.

First low pass filter 14 filters signal exiting first multiplier 13, and at a further output port 18, supplies the real part of the voltage electric signal $S_V$, corresponding to the real part of the reciprocal of the complex impedance $Re[1/Z]$.

In case optical medium 1 is a semiconductor waveguide, the presence of the optical radiation generates an increase of the electric charge carriers which corresponds to a decrease of the resistance $R_{WG}$ associated to core 5.

Computing module 6 calculates the resistance $R_{WG}$ from the reciprocal of complex impedance $Re[1/Z]$. Monitoring magnitude $Re[1/Z]$, performed by the measuring circuit 50 and computing module 6, and particularly monitoring resistance $R_{WG}$, present at the further output port 18, enables to detect, upon a suitable calibration, the presence and the intensity of the optical radiation.

Referring to the embodiment modes of the measuring circuit 50, it is observed that the CMOS technology enables, besides an extreme miniaturization and an integration with photonic integrated circuits, the multichannel parallelization and a reduction of the electric parasitic components associated to the connections, which in turn translates in a substantial improvement of the performance, above all in terms of sensibility. In fact, the noise (and consequently the resolution) of the transimpedance amplifier 7 is limited by the value of the input parasitic capacitance CE, typically prevailing with respect to the access capacitances. These parasitic capacitances are mainly due to the connection wires and to the capacitive coupling between each of the first and second metal electrodes 2, 3 through the substrate of first waveguide WG1. The reduction of said capacitive parasitic couplings will produce an improvement of the detecting system 100 resolution.

Moreover, detecting system 100, particularly the exemplifying arrangement in FIG. 5, can be implemented by a monolithic integration of the photonic systems with microelectronic circuits of the same substrate. However, detecting system 100 can be also implemented according to anyone hybrid and heterogeneous arrangement, such as in the case of two separated chips (side by side in the same package, having bonding wires among the pads for the electric connections) or such in the case of the direct chip-to-chip bonding or the 3D stacking (a connection implemented by overlapping pads or by through-silicon-vias).

Reference is made now to first and second electrodes 2, 3, which are preferably one or more conductive contacts arranged around first waveguide WG1. Such conductive contacts can be implemented by using metal pads, highly doped semiconductor materials, or any other composite material showing an advantageously high electric conductivity.

Figure 6:
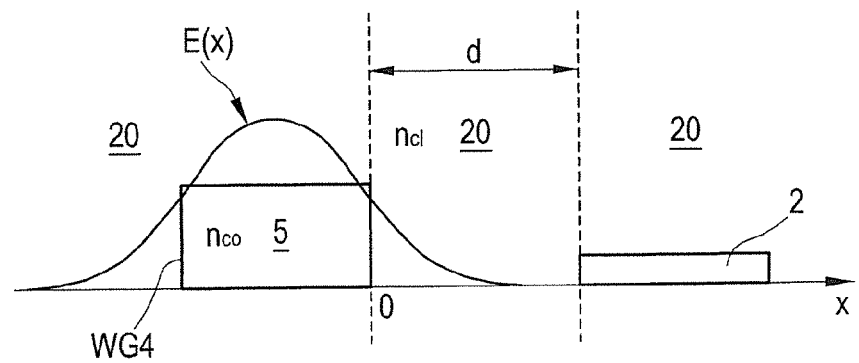
FIG. 6 shows an example of an embodiment of an integrated waveguide and of an integrated electrode employable in said detecting system.

It is considered as an example of optical medium 1, a fourth integrated waveguide WG4, having a rectangular cross-section, shown in FIG. 6 and comprising a corresponding core 5 with refraction index $n_{c0}$, and a corresponding upper cladding 20, with refraction index $n_{cl}$.

As already observed, first and second electrodes 2, 3 are positioned at a suitable distance d (FIG. 6) from the material of core 5 of the fourth rectangular cross-section waveguide WG4 for avoiding to attenuate the electromagnetic field. According to the arrangement in FIG. 6, which shows only first electrode 2, the minimum distance between core 5 and first electrode 2 can be evaluated by considering the length by which the evanescent electric field penetrates in cladding 20. The same approach is true for second electrode 3 or for a further possible used electrode. The amplitude of the electric field E(x) in the cladding region 20 typically decreases according to an exponential decay given by the following relationship:

$$E(x)=E_0 \exp(-\gamma x), \quad (1)$$

wherein $E_0$ is the amplitude of the electric field at the core-cladding interface, and $\gamma$ is the decay constant of the electric field inside the cladding region. Decay constant $\gamma$ can be expressed by the following relationship:

$$\gamma = \frac{2\pi}{\lambda}\sqrt{n_{eff}^2 - n_{cl}^2} \quad (2)$$

Wherein: $\lambda$ is the wavelength of the optical radiation and, $n_{eff}$ is the effective refraction index of the optical mode propagating in the fourth rectangular waveguide WG4.

According to a further sizing example, in order to avoid disturbances in the optical radiation and therefore in the electromagnetic field, distance d is selected so that it is sufficiently high to make the amplitude of the evanescent electric field of the optical radiation at second electrode 2 negligible, in other words $|E(d)/E_0| \ll 1$.

According to what has been said before, it is assumed as minimum distance: $d_{min}=6/\gamma$, at this value there is a reduction of the intensity of the field $|E(d)/E_0|^2$ at the interface with the electrode 2 equal to about 52 dB. It is observed that, according to formula (2), the minimum distance $d_{min}$ depends on the wavelength of the optical radiation and on all the optical parameters affecting the effective waveguide of index $n_{eff}$, in other words the difference of the refraction index $(n_{co2}-n_{cl})$, the size and shape of the waveguide, and the polarization state of the optical radiation.

The upper limit of the maximum distance $d_{max}$ is given by the sensibility of the measuring electric circuit 50 to the variations of the electric properties in optical medium 1. At a greater distance there are higher access impedances $Z_1$ and $Z_2$. For example, in case of a purely capacitive coupling $(Z_1=1/2\pi fC)$, as shown in FIG. 5, access impedance can be simply estimated by calculating the capacitance of a flat capacitor (a plate being the metal electrode and the other plate being the waveguide) as $C=\varepsilon A/d$, wherein A is the effective area of the capacitor, $\varepsilon=\varepsilon_0 \varepsilon_r$, wherein $\varepsilon_0 \varepsilon_r$ are respectively the vacuum permittivity and the relative dielectric constant of the material arranged between the plates of said capacitor. It is clear that the capacitance is inversely proportional to d and that, for a given frequency f, the increase of d corresponds to an increase of first access impedance $Z_1$. Maximum voltage applied to the probe is typically limited to 0.1-10 V (due to technical constraints and also for avoiding disturbances in the light signal and non linear effects). An access impedance increase translates in a reduction of the probe electric current. The upper limit $d_{max}$ is therefore determined by the resolution (that is the noise) in the electric detecting circuit.

Since first access impedance $Z_1$ and second access impedance $Z_2$ are serially connected to impedance $Z_0$ associated to core 5, the optimal condition for measuring $Z_0$ is when the sum $(Z_1+Z_2)$ is negligible with respect to $Z_0$. However, in order to fulfill the condition $d>d_{min}$, access impedances $Z_1$ and $Z_2$ can be made greater than $Z_0$ and even dominant. Quantitative project rules, particularly for this latter more critical condition, depend on the particular geometry and some of them will be discussed in the following with reference to particularly cases.

Figure 7:
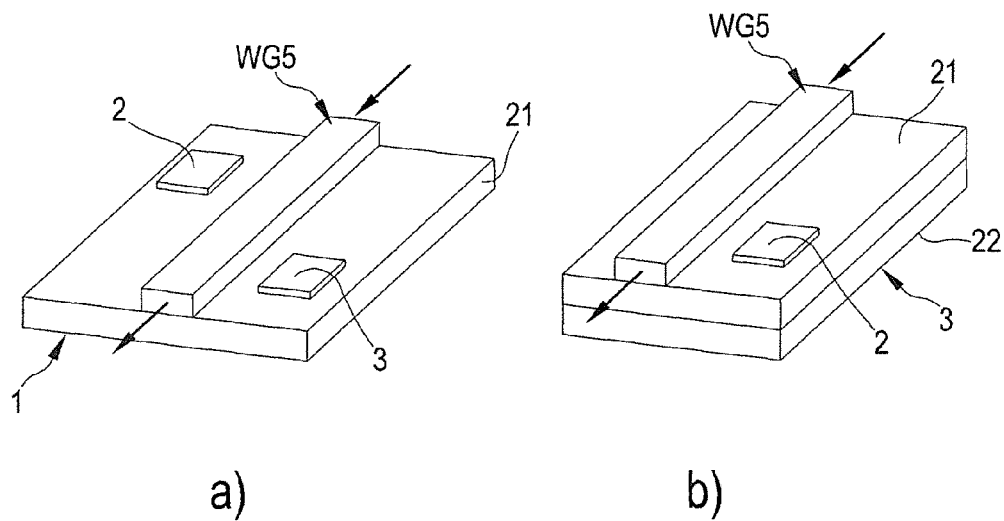
FIGS. 7($a$) and 7($b$) show examples of embodiment of integrated waveguides and electrodes.

FIG. 7(a) and FIG. 7(b) show other embodiments of optical medium 1 and first and second electrodes 2, 3, when the waveguides are integrated on a substrate. Specifically, FIG. 7(a) shows an optical medium 1 comprising a first substrate 21 supporting a fifth waveguide WG5, having a rectangular cross-section. First and second electrodes 2, 3 made of a conductive material, are arranged on the same side of substrate 21 from which fifth waveguide WG5 projects, but they lie on opposed portions with respect to fifth waveguide WG5 and are suitably spaced from the latter. It is also observed that it is possible to use a number of electrodes greater than two and arranged laterally or on fifth waveguide WG5, opposed with respect to the waveguide or on the same side with respect to the waveguide, in order to maximize the sensibility of the detecting system 100 to a variation of the electrical parameters of optical medium 1, induced by a light radiation.

FIG. 7(b) shows an optical medium 1 comprising, besides first substrate 21, which sixth waveguide WG6 is formed on, and one of the electrodes (for example first electrode 2), also a second conductive substrate 22 which can act as second electrode 3.

This case of FIG. 7(b) comprises, for example, optical waveguides formed on a semiconductor substrate, such as silicon, InP and AlGaAs, and enables to reduce the number of electrodes to be formed on an optical chip, since second substrate 22 can be used as a common ground plane for different detecting units arranged in different positions of a photonic integrated circuit. What has been said above with reference to FIGS. 7(a) and 7(b) can be applied both to ridge-type and rib-type waveguides.

With reference, for example, to second waveguide WG2 (ridge-type) or third waveguide WG3 (rib-type) it is observed that, as said before, core 5 or claddings 8 or 20 can be made of a semiconductor material. In a semiconductor, the main physical mechanism modifying the electric parameters of the optical medium in the presence of an optical radiation, particularly a light radiation, is the free carriers generation. The free carriers generation in semiconductors due to a light radiation can occur both inside a homogeneous material and at the interface between two different materials.

In a transparent homogeneous material, the absorption is inhibited at those wavelengths at which the energy jump $E_g$ between electronic bands is greater than the energy of a photon. However, a simultaneous absorption of two photons can occur if the sum of the energy associated to the two photons is greater than the energy gap $E_g$ of the material at the photon frequency. This phenomenon, known as two photon absorption (TPA), causes the generation of an electron-hole pair for each pair of absorbed photons. A typical example is given by a semiconductor material, for example silicon ($E_g$=1.1 eV) or indium phosphide ($E_g$=1.35 eV), which is transparent above a wavelength of 1000 nm, but has a TPA until a wavelength of about 2000 nm.

At the interface between two materials, the energy bands are more distorted than in a homogeneous material, and typically the energy gap is substantially reduced. Referring to the case of Si and InP, this means that at the surface of the material there is a certain probability of absorbing a single photon, in other words it exists the probability of generating electron-hole pairs from a single photon, also at a wavelength greater than 1000 nm.

Detecting system 100 can be based both on the generation of carriers at the interface between two materials, such as the material of cladding 5 and the material of core 8 and/or 20 (this being the generally prevailing effect at a low level of the optical power), and on the generation of carriers inside homogeneous materials (wherein the TPA effects become prevailing at a high level of the optical power).

Figure 8:
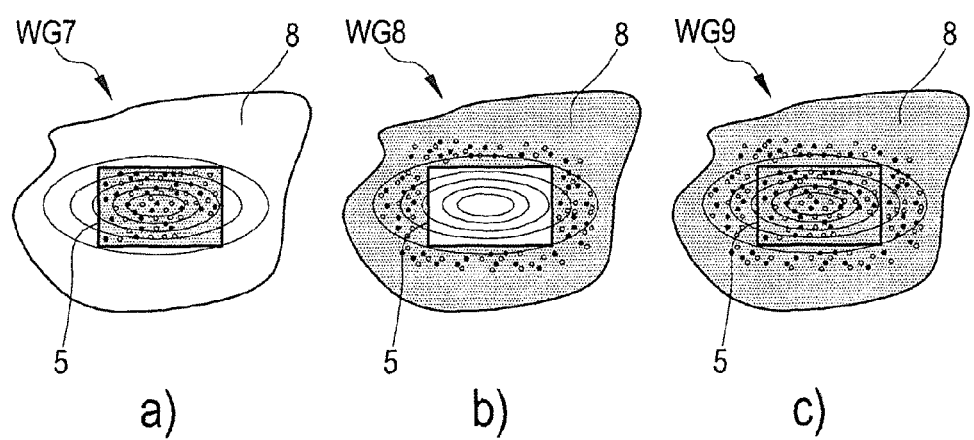
FIGS. 8($a$), 8($b$) and 8($c$) schematically show cross-sections of examples of optical fibers made by a silicon technology, employable as optical medium for said detecting system.

FIG. 8 schematically shows some examples of optical waveguides made by a semiconductor technology, useable as optical medium 8 for the detecting system 100. Semiconductor material can be used only in the region of core 5 of a seventh waveguide WG7 [FIG. 8(a)], only in cladding 8 of an eighth waveguide WG8 [FIG. 8(b)], or both for core 5 and cladding 8 of a ninth waveguide WG9 [FIG. 8(c)]. In any case, the light propagation through the waveguide is responsible of the generation of carriers, locally in the semiconductor region hit by the optical radiation. The carriers density variation is responsible of a local variation of the electrical properties of the semiconductor material, which implies a variation of the electric parameter measured by the measuring circuit 50.

Figure 9:
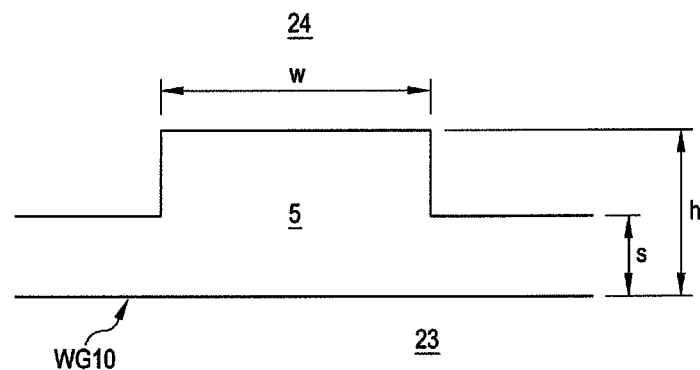
FIG. 9 shows a cross-section of an example of an optical waveguide integrated on a silicon-on-insulator-type (SOI) platform.

FIG. 9 refers, for example, to the embodiment of a tenth waveguide WG10 useable as optical medium 1. Tenth waveguide WG10 of a rib-type is manufactured on a silicon-on-insulator (SOI) type platform. According to a particular example, silicon core 5 (refraction index $n_{Si}$ equal to 3.45) has a width w comprised between 100 nm and 5 μm and a height h comprised between 50 nm and 5 μm. Thickness s of the side core region is preferably comprised between 0 (a silicon material completely removed at the sides of the waveguide) and 90% h. There is an electrically insulating material forming a further lower cladding 23 under the silicon core 5. The thickness of the lower cladding material 23 is preferably comprised between 500 nm and 10 μm. A dielectric material can be added as an upper cladding 24 on silicon core 5. The preferred thickness of the upper cladding material 24 is comprised between 0 (in this case the cladding is formed by air) and 5 μm.

Figure 10:
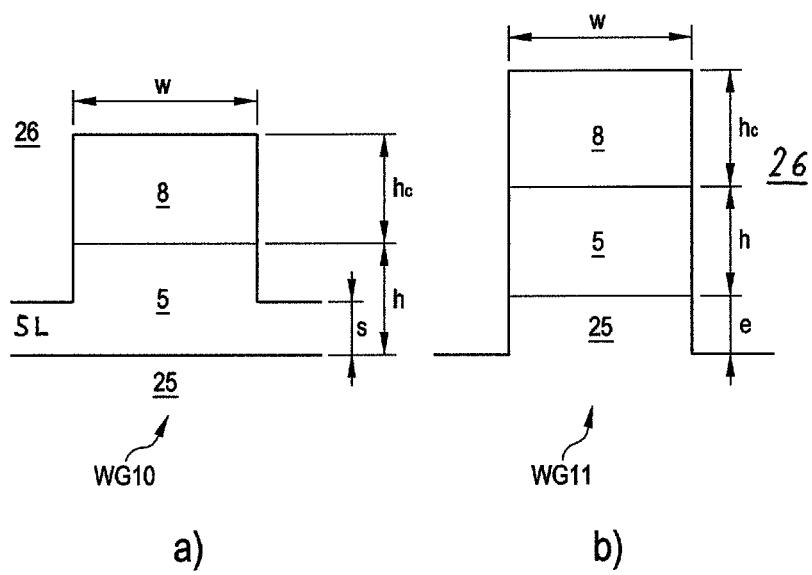
FIGS. 10($a$) and 10($b$) show cross-sections of further examples of waveguides made by the indium phosphide (InP) technology.

With reference to FIG. 10, two other examples of waveguides useable as optical medium 1 and fabricated by an indium phosphide technology (InP) will be now described.

FIG. 10(a) shows a tenth waveguide WG10 of rib-type, comprising a corresponding InP substrate 25, a corresponding core 5 made also with InP and having a refraction index greater than the one of substrate 25. Particularly, core 5 of tenth waveguide WG10 can have, for example, a refraction index comprised between 3.2 and 3.5. For example, core 5 width w is comprised between 0.5 μm and 5 μm and has a height h comprised between 0.1 and 5 μm.

Further, tenth waveguide WG10 is provided with at least one upper cladding layer 8, but it is possible to add also other layers, also made with InP having a refraction index less than the one of the core 5 layer, and preferably comprised between 3.15 and 3.20. Cladding layer 8, if present, of tenth waveguide WG10 has, for example, a thickness hc smaller than 5 μm. Core 5 layer comprises a side region 5L, having a thickness s preferably comprised between 0 (a complete removal of the side region of the core of the waveguide) and 90% of height h. Tenth waveguide WG10 can contact air or another dielectric covering material 26 having a refraction index less than the one of core 5 material.

FIG. 10(b) shows a cross-section of an eleventh optical waveguide WG11 made by an indium phosphide technology (InP), of ridge-type, comprising a corresponding substrate 25, a corresponding core 5 and a corresponding cladding 8 made of indium phosphide. Core 5, cladding 8 and substrate 25 refraction indexes of eleventh waveguide WG11 and core 5 and cladding 8 thicknesses of eleventh waveguide WG11 are analogous to the ones defined with reference to the tenth waveguide WG10. Substrate 25 of eleventh waveguide WG11 defines, under the core 5 layer, a region having thickness e and raised with respect to the side zones of substrate 25 itself.

Experiment 1 (Silicon Technology)

Figure 11:
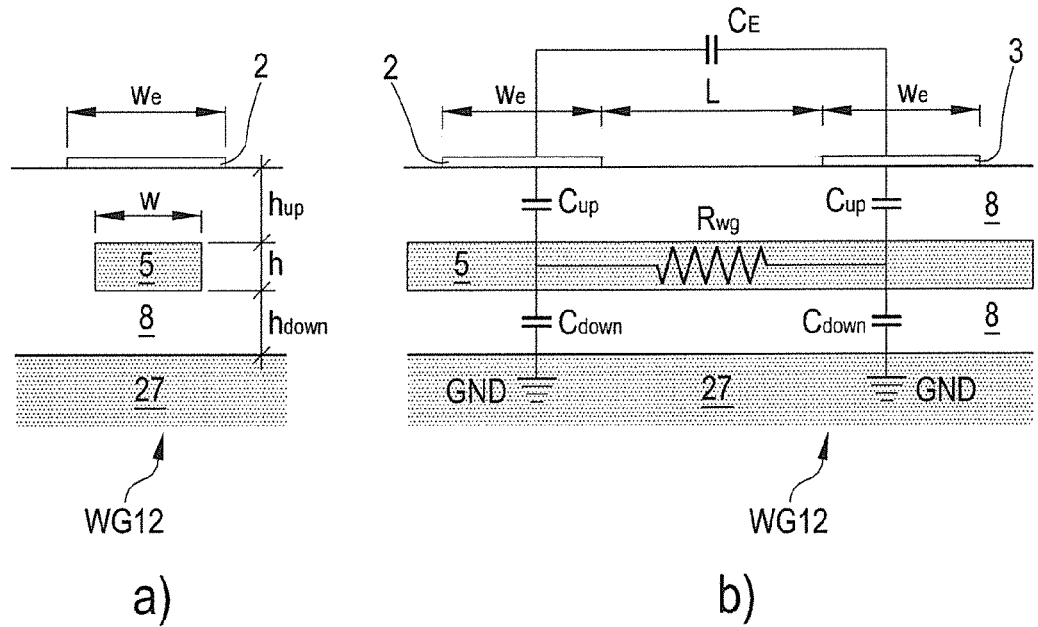
FIG. 11($a$) shows a cross-section of a first experimental waveguide integrated on silicon and used for a first experiment.

The Applicant has implemented a first experiment by using as optical medium 1 a twelfth waveguide WG12 integrated on silicon and shown by a transversal section in FIG. 11(a).

As shown in FIG. 11(a), silicon core 5 has a rectangular shape and is buried in a homogeneous cladding 8 made of glass (more particularly, silicon dioxide, $SiO_2$) formed on a silicon substrate 27. First and second electrodes 2, 3 (not shown in FIG. 11(a)) are made of metal and are positioned on the upper part of twelfth waveguide WG12 at a vertical distance $h_{up}$ from core 5. Such distance $h_{up}$ has been selected in order to avoid further optical losses with respect to the propagation loss of the waveguide without metal electrodes, and according to previously described principles.

More particularly, core 5 has a rectangular shape having a width w=1 μm and height h=220 nm. The cladding 8 thickness is greater than $h_{up}$=900 nm and a thickness less than $h_{down}$=2 μm with respect to the opposed faces of core 5. Substrate 27 has a thickness of about 500 μm. Both first electrode 2 and second electrode 3 have a quadrangular shape having an area of $w_e^2$=200 μm×200 μm. The distance L, parallel to the twelfth waveguide WG12 propagation axis, between first and second electrodes, is L=700 μm.

FIG. 11(b) shows a longitudinal section of twelfth waveguide WG12 overlapped on its electric equivalent circuit. Due to the intrinsic doping level of the conventional SOI wafers (free carriers density in the order of $10^{15}$ $cm^{-3}$), silicon core 5 mainly acts as a resistor of resistance $R_{WG}$. The glass of cladding 8 acts as a coupling capacitance towards the first and second metal electrodes 2, 3 (two capacitors are shown, each having an access capacitance towards the electrodes $C_{up}$) and towards silicon substrate 27 (other two capacitors are shown, each having an access capacitance towards the substrate $C_{down}$). A further parasitic capacitance ($C_E$) exists between the first metal electrode 2 and second metal electrode 3.

The light amount present in twelfth waveguide WG12 has been evaluated by measuring the total electric impedance Z measured between first electrode 2 and second electrode 3 by a measuring circuit 50 analogous to the one described with reference to FIG. 5.

Between first and second electrodes 2, 3, it is applied an AC electric signal $V_{AC}$ having an amplitude equal to 0.8 V, in order to avoid any substantial modulation effects of the optical radiation. Frequency $f_0$ of electric signal $V_{AC}$ has been selected in order to pass through the access capacitance to electrodes $C_{up}$ and was equal to $f_0$=2 MHz.

This operative frequency $f_0$ has been selected based on the following considerations. As shown in FIG. 11(b), in the particular geometric arrangement of first and second electrodes 2, 3, the horizontal distance L between the electrodes determines the value of resistance $R_{WG}$ (given by the silicon resistivity $\rho_{Si}$=5.7 Ω·cm and the cross-section of twelfth waveguide WG12).

Vertical distances $h_{up}$ between electrodes 2 and 3 and core 5 together with electrode length $w_e$ and core 5 width w, determine the value of the access capacitance towards electrodes $C_{up}$. Therefore, the access capacitance value towards electrodes $C_{up}$ can be estimated as $C_{up}=\epsilon_0 \cdot \epsilon_{SiO_2} \cdot / w_e \cdot w)/(h_{up}-h) \approx 10$ fF, wherein $\epsilon_0$ and $\epsilon_{SiO_2}$ are respectively the vacuum permittivity and the dielectric constant of $SiO_2$. Since the resistance of twelfth waveguide WG12 without light has been estimated as $R_{WG}=\rho_{Si} \cdot L/(h \cdot w)$=180 MΩ, the frequency at which the module of access capacitance impedance towards electrodes $C_{up}$ is equal to resistance $R_{WG}$ is approximatively given by the pole frequency $f_{pole}=1/(2\pi R_{WG} C_{up}/2)$=177 kHz.

Therefore, in order to fall in the spectral region wherein the total impedance Z is dominated by $R_{WG}$, the operative frequency $f_0$ is set 10 times more $f_{pole}$, that is about 2 MHz.

The Applicant has observed the parasitic capacitance $C_e$ between first and second electrodes 2, 3 (which according to performed measures is about 1 pF), forms a parallel path for probing the alternate current which for these frequency values is about 1000 times more conductive than $G=1/R_{WG}$. Therefore, the conductivity variations of core 5 to be detected, overlap a total admittance dominated by a parasitic component 1000 times greater than the total admittance.

Since the admittance parasitic component of the twelfth waveguide WG12 is imaginary, while the conductivity variation to be measured (that is the portion affected by light) is real, a detecting system capable of separating components perpendicular to each other (as the lock-in type demodulator 9 of the measuring circuit 50) can easily extract variations of $G=1/R_{WG}$ independently from the presence of $C_e$.

It is also observed the presence of phase delays introduced by the acquisition chain of the electric signal (cables, finite band of the amplifier, etcetera) makes more difficult the detection, because small variations of the admittance imaginary part (1000 greater than the signal to be measured) can produce substantial errors on the estimate of the real part.

Therefore, a complete measurement of the real and imaginary parts of the impedance (or admittance), by a low noise current detecting system (having a resolution better than one part out of $10^4$), as obtainable by the measuring circuit 50 of FIG. 5, seems advantageous.

It is observed that, assuming an operative maximum frequency $f_0$=100 MHz, and maintaining fixed the horizontal arrangement shown in FIG. 11(a), distance $h_{up}$ between metal electrodes 2, 3 and core 5 can be increased to a maximum of fifty times. However, the horizontal distance L decrease between the electrodes causes a reduction of the volume under core 5, in other words a lower resistance $R_{WG}$ (a greater conductance G). By considering that, for a light power inside the waveguide greater than −10 dBm, the ratio signal-noise is greater than 10, such distance L can be decreased of one order of magnitude, without modifying the measuring system parameters.

In the experiment, twelfth waveguide WG12 has been coupled to a continuous optical signal having a wavelength of 1550 nm.

Figure 12:
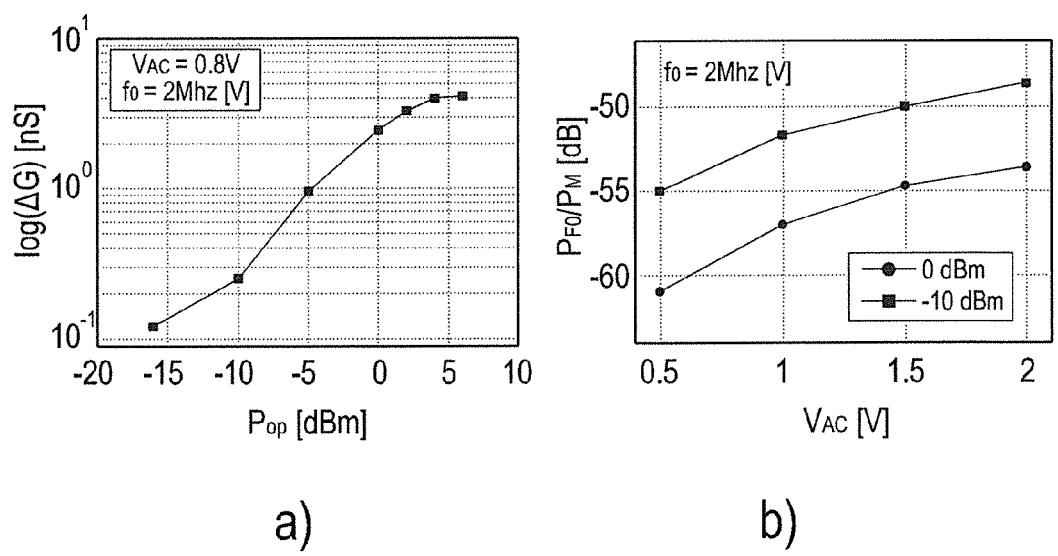
FIG. 12($a$) shows an experimental curve representative of a variation of conductance associated to the waveguide of FIG. 11($a$) as a function of the optical power.

FIG. 12(a) shows the variation ΔG of the measured conductance $G=1/R_{WG}$ of the waveguide as a function of the local optical power $P_{op}$. When the power inside the twelfth waveguide WG12 increases from −16 dBm to +6 dBm, conductance G consequently increases, showing in this way a ΔAG variation from 0.1 nS to 4 nS. Therefore, it is possible to obtain a unique measurement of power $P_{op}$ of the light flowing through the twelfth waveguide WG12 by measuring conductance G.

The Applicant has further verified the substantial absence, or negligibility, of the modulation effects on the optical radiation at a wavelength of 1550 nm flowing through twelfth waveguide WG12 caused by a voltage electric signal $V_{AC}$ at a frequency $f_0$ equal to 2 MHz with a voltage increasing from 0 to 2 V.

The presence of possible effects of the optical modulation on the optical signal at the frequency of the applied electric signal $V_{AC}$ has been examined by a lock-in amplifier having a band width of 1 Hz. The curves in FIG. 12(b) show the ratio of power $P_{f0}$ of a disturbance optical signal, in other words of the light modulated at frequency $f_0$ of the applied voltage, to the light average power $P_M$, measured after the propagation through the region of the waveguide where the electrodes are present.

The measurement has been done at two levels of the optical power in the waveguide, −10 dBm and 0 dBm, as it is apparent from the caption of FIG. 12(b). In both cases, the disturbance induced by electrodes 2 and 3 is less than −50 dB for an applied voltage $V_{AC}$ less than 0.5 V.

More generally, referring also to other described embodiments, the ratio of power $P_{f0}$ of the noise optical signal to the input signal average power $P_M$ of the light, measured after the propagation through the region 5 of optical medium 1, is less than −20 dB, preferably less than −30 dB, more preferably less than −40 dB, and still more preferably less than −50 dB.

Experiment 2 (Indium Phosphide Technology)

Figure 13:
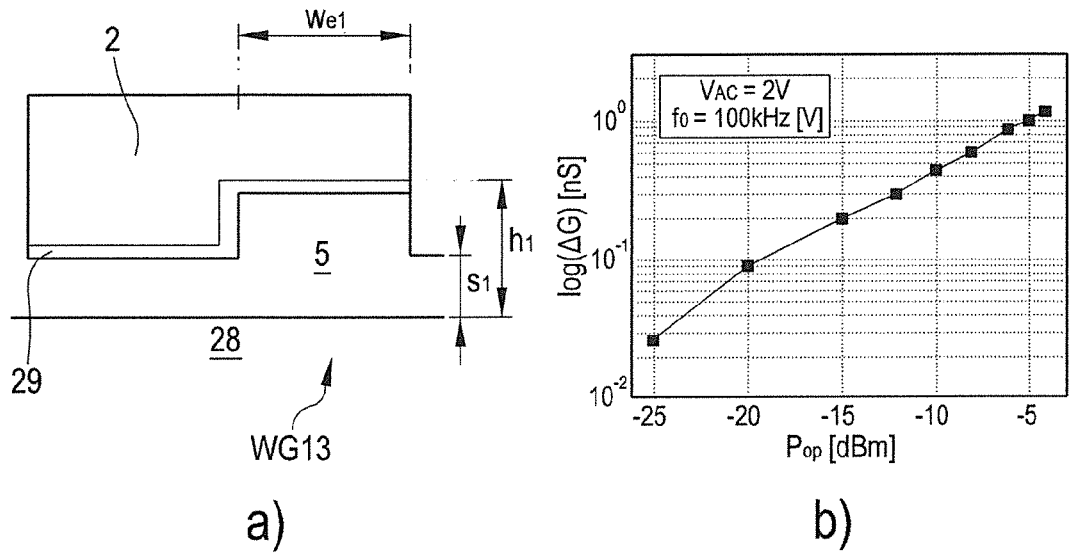
FIG. 13($a$) shows a cross-section of a second experimental waveguide integrated on indium phosphide InP and used for a second experiment.

The Applicant had implemented a second experiment by using as optical medium 1 a thirteenth indium phosphide (InP) integrated waveguide WG13 and shown by the cross-section of FIG. 13(a).

The central layer of the InP material of core 5 has a thickness $h_1=1$ μm and a refraction index $n_{co}=3.26$, and is formed on a InP substrate 28 with refraction index $n_{cl}=3.17$.

The core 5 portion of the thirteenth waveguide WG13 has a width $we_1=2.5$ μm and a side region having a thickness $s_1=0.4$ μm. There is no dielectric layer on the upper part of the core material.

First and second metal electrode 2, 3 (2.5 μm×10 μm) are formed on a layer 29 of silicon nitride ($Si_3N_4$) having a thickness of 120 nm. The relative distance between first electrode 2 and second electrode 3 is L≈2000 μm.

Conductance G variation measurement has been performed by a measuring circuit analogous to measuring circuit 50 of FIG. 5.

FIG. 13(b) shows the variation ΔG of the measured conductance $G=1/R_{WG}$ of the thirteenth waveguide WG13 as a function of the local optical power $P_{op}$. The applied voltage signal $V_{AC}$ has an intensity $V_{AC}=2$ V and a frequency $f_0=100$ kHz. The continuous signal of the light coupled to the thirteenth waveguide WG13 has a wavelength of 1550 nm. When the power $P_{op}$ inside the thirteenth waveguide WG13 increases from −25 dBm to −4 dBm, the measured conductance increases, showing in this way a variation ΔG from 0.03 to 1.2 nS. Therefore, the electric conductivity measurement of the waveguide gives a unique measurement of the light power $P_{op}$ present inside the thirteenth waveguide WG13.

Further Embodiments

Optical Probing

The possibility of measuring the light radiation amount inside the optical medium 1, substantially without altering the properties of the same light radiation, can be advantageous in different applications.

Figure 14:
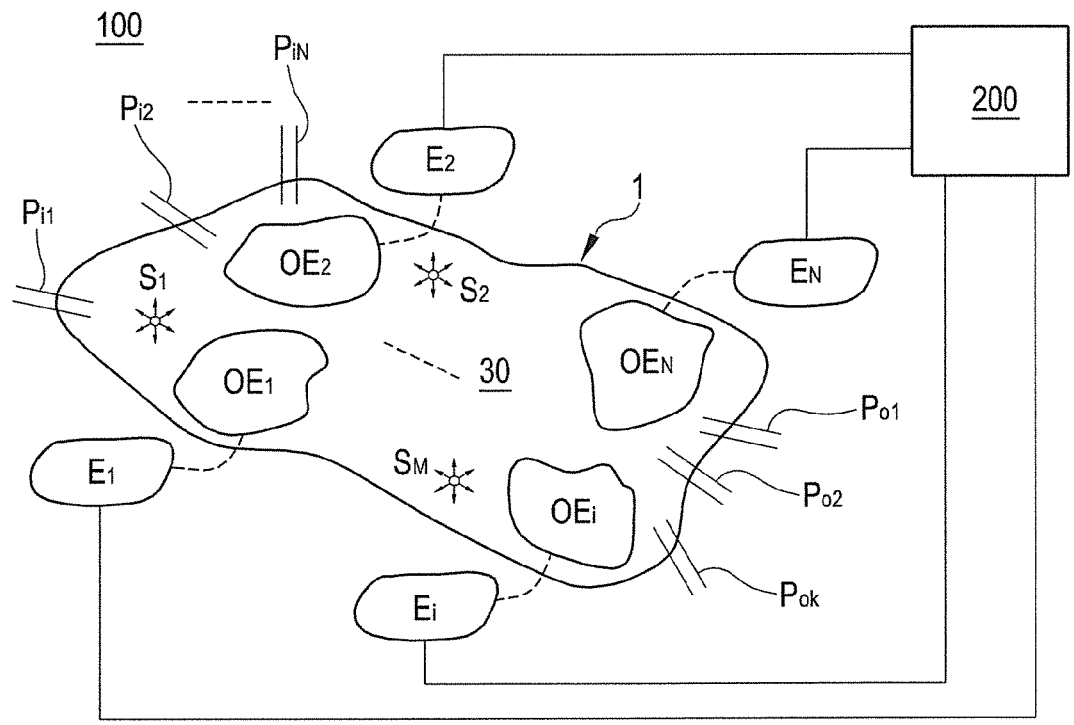
FIG. 14 shows a second embodiment of the optical radiation detecting system comprising a plurality of optical components.

A first application example is the optical probing, substantially non perturbative, which can be used for locally inspecting the actual condition of an optical circuit. FIG. 14 shows a particular embodiment of the detecting system 100, wherein optical medium 1 comprises an optical circuit 30 comprising a plurality of optical elements $OE_1$, $OE_2$, ..., $OE_j$, ..., $OE_N$ suitable for being subjected to the optical radiation. Detecting system 100 comprises also a plurality of electrode pairs $E_1$-$E_N$ electrically coupled to the optical elements $OE_1$-$OE_N$ (such coupling is symbolically represented in FIG. 14 by a dashed line). Each electrodes pair of the plurality of electrodes $E_1$-$E_N$ is arranged at a distance from a corresponding optical element of the plurality of elements $OE_1$-$OE_N$, which can be calculated in the same way as described above with reference to first and second electrodes 2, 3. Moreover, each pair of electrodes of the plurality of electrodes $E_1$-$E_N$ is electrically connected to an electronic block 200 comprising, for example, one or more electric power generators 4, and one or more measuring circuits 50 which can be analogous to the ones described above.

Optical circuit 30 is provided with a plurality of input ports $P_{i1}$, $P_{i2}$, ..., $P_{iJ}$ for the optical radiation. Optical radiation can also be generated inside the optical circuit 30 by one or more radiation sources $S_1$, $S_2$, ... $S_M$. Light radiation exiting optical circuit 30 can be observed by a plurality of output ports $P_{o1}$, $P_{o2}$, ..., $P_{oK}$.

The optical properties of the light radiation at the output ports $P_{o1}$, $P_{o2}$, ..., $P_{oK}$ depend on the properties of the light radiation entering the optical circuit 30, or generated inside it, and on the actual condition of the optical circuit 30, in other words depend on the condition of each optical element $OE_1$-$OE_N$ comprised in the optical circuit 30.

By the measurements of the electric parameters, obtained by the electronic block 200, it is possible to obtain information about the light intensity inside each optical element $OE_1$-$OE_N$, in order to therefore enable a complete knowledge of the actual condition of the optical circuit 30 in its entirety. The knowledge of the actual condition of a circuit enables to monitor in real time the operative condition of the optical circuit itself, so that it is possible to perform operations such as a failure detection, a circuit dynamic reconfiguration and a light routing along desired paths.

Optical Resonator

Figure 15:
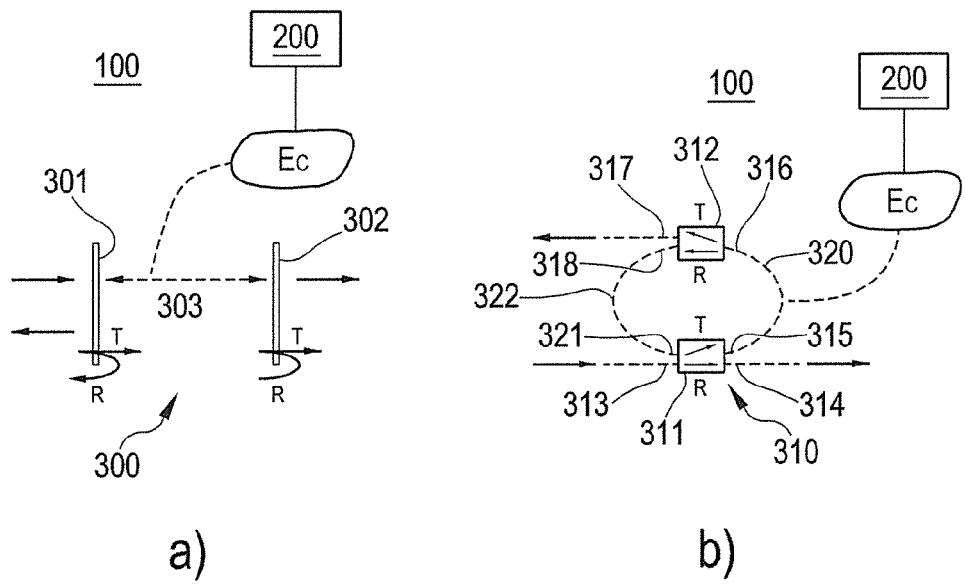
FIG. 15(a) shows an example of a Fabry-Pérot resonator useable as an optical medium in system in FIG. 1 or FIG. 14.
FIG. 15(b) shows an example of a ring resonator useable as an optical medium in system of FIG. 1 or FIG. 14.

According to another embodiment, optical medium 1 of detecting system 100 comprises a first Fabry-Pérot-type optical resonator 300, exemplifyingly shown in FIG. 15(a). The optical resonator is also a transmissive optical medium according to the above mentioned definition.

In this case, detecting system 100 can be used to evaluate if first optical resonator 300 operates in a resonance condition, without the necessity of measuring the light intensity at a resonator port and without altering the resonator characteristics, such as for example the quality factor Q, but using the measurements of electric parameters. In first optical resonator 300, as in each optical resonator, optical radiation is compelled to recirculate through an optical path by a feedback structure.

More particularly, first optical resonator 300 comprises a first mirror 301 and second mirror 302 having a transmittance T and reflectance R, which implement the desired feedback. A first pair of electrodes $E_c$, analogous to the already described first and second electrodes 2, 3, are connected to the electronic circuit 200 comprising a corresponding electric signal 4 generator and a corresponding measuring circuit 50 for measuring electric parameter variations in optical material 300 as the optical radiation power varies.

As a consequence of the optical feedback, the transmittance through the optical resonator 300 is strongly dependent on the optical radiation wavelength, so that the optical resonators become fundamental devices for implementing optical filters, and more generally for handling a light radiation. By considering the arrangement in FIG. 15(a), the transmittance intensity $H_2$ of the radiation from the input port, corresponding to the first mirror 301, to the output port, corresponding to the second mirror 302, is given by the following relationship:

$$|H_2|^2 = \left| \frac{T}{1 - R\exp(-j\phi)} \right|^2 \quad (3)$$

wherein:

$\phi = 2\pi f n_{eff} L_r/c$ is the round trip phase of resonator, $L_r$ is the geometric length of the resonator round trip (equal two times the geometric distance between the mirrors), $n_{eff}$ is the effective refraction index of the optical material 303 comprised between first and second mirrors 301, 302; f is the optical signal frequency, and c is the light speed in vacuum.

Figure 16:
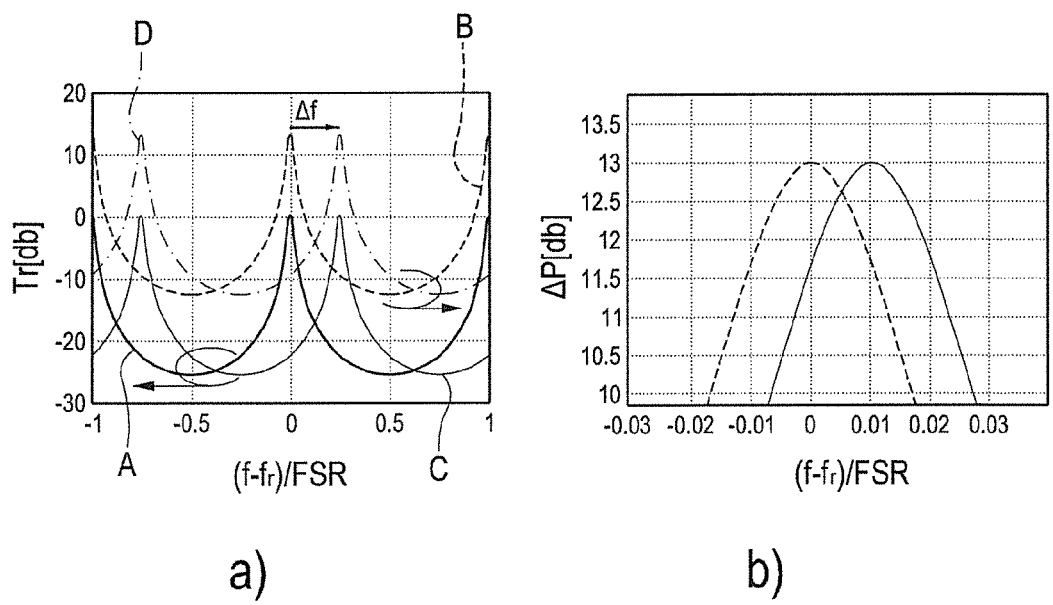
FIGS. 16(a) and 16(b) show curves regarding a transmission and increase of the power in the Fabry-Pérot resonator in FIG. 15(a), as a function of the normalized frequency.

FIGS. 16(a) and 16(b) refer to the transmittance $T_r$ and to the increase $\Delta P$ of the power inside the first Fabry-Pérot resonator 300, with R=0.1 and T=0.9 as a function of the normalized frequency fn=(f−fr)/FSR.

FIG. 16(b) shows (first curve A) the intensity of transmittance $|H_2|^2$ of first optical resonator 300 having R=0.1 and T=0.9 as a function of the normalized optical frequency (f−$f_r$)/FSR, wherein the free spectral range FSR=c/$n_g$L gives the periodicity of the spectral response, wherein $n_g$ is the refraction index of the effective group of the optical material 303.

At certain frequencies, in other words the resonance frequencies $f_r$ of the resonator, the phase $\phi$ is equal to $\phi=2\pi f\ n_{eff}L_r/c=2\pi M$ (wherein M is an integer), the transmittance is maximum, while the minimum is when $\phi=2\pi f\ n_{eff}L_r/c=\pi (2M+1)$.

As a consequence of the optical feedback, the forward optical power (I⁻) and the backward optical power (I⁻) inside first resonator 300 are increased with respect to the input radiation power of a factor F⁺ and a factor F⁻, respectively:

$$F^+ = \frac{T}{|1 - R\exp(-j\phi)|^2} \quad (4)$$

and $$F^- = \frac{RT}{|1 - R\exp(-j\phi)|^2} \quad (5)$$

The propagating radiation (I*) and the counter propagating radiation (I⁻) have the same optical path, so that an average increase factor:

$$F_{av} = \frac{(1 + R)T}{|1 - R\exp(-j\phi)|^2} \quad (6a)$$

is observed inside first resonator 300.

Particularly, a thick dashed line (second curve B) in FIG. 16(a) shows the increase of the average intensity inside a Fabry-Pérot resonator with a transmittance $|H_2|^2$ as a function of the normalized optical frequency fn=(f−fr)/FSR, wherein fr is the first resonance frequency. The intra-cavity intensity increase is the greatest at those frequencies (the resonance frequencies) at which the transmittance is the greatest.

Therefore, by measuring the optical power level inside the first resonator 300, it is possible to know if it operates under a resonance condition, without the necessity of measuring the light exiting first resonator 300. The optical power measurement is obtained by measuring an electric parameter, for example, the impedance variation in optical material 303, by measuring circuit 50.

Assuming, for example, an optical signal entering at a frequency f=$f_r$, in first resonator 300, inside said resonator it will be observed an intensity increase of 13 dB. Due to a variety of physical effects (thermal fluctuations, cross-talk due to adjacent devices, aging, non linear effects caused by other optical signals, etcetera), the resonator resonance frequency can shift with respect to the optical signal frequency, in order to cause a reduction of the intensity inside the cavity.

As shown by thin line curves (third curve C and fourth curve D) in FIG. 16(a), a reciprocal shift of FSR/4 could degradate the increase factor of more than 20 dB.

FIG. 16(b) shows that a small shift equal to 0.01 FSR, corresponding to about 25% of the transmission bandwidth of 3 dB of the resonator, would degradate the increase factor of about 1.5 dB. Once it is detected a misalignment between the resonator resonance frequency and the optical signal frequency, the resonator resonance frequency can be adjusted by means of conventional actuators (for example heaters).

The main advantage offered by the detecting system 100 comprising the optical resonators consists in the possibility of detecting a resonator resonance condition without the necessity of extracting the light intensity (neither inside the resonator nor at the output port), and without altering the quality factor of the resonator, because this parameter is extremely sensible to further losses occurring inside the resonator.

FIG. 15(b) shows a second optical resonator 310, of the resonant ring-type, wherein the optical feedback is provided by a first power divider 311 and by a second power divider 312 which divide the input light in two paths, according to the ratios T and R, respectively. First power divider 311 comprises a first input 313 (for the optical radiation) and a first output 314 and a second output 315. Second power divider 312 comprises a second input 316 and a third output 317 and a fourth output 318. Second output 314 is optically coupled to second input 316 by, for example, a first optical waveguide segment (or an optical fiber or a segment in free space according to the kind of technology used) 320, while fourth output 318 is optically coupled to further input 321 of first divider 311 by a second integrated optical waveguide segment 322 (or an optical fiber or a segment in free space according to the kind of technology used). For the second resonator 310 are still true considerations analogous to the ones given with reference to the first resonator 300.

Plurality of Coupled Resonators

In some optical circuits based on optical resonators, it is not possible to directly access to the output ports of the resonators, so that the only way to know the resonator condition, according to the conventional techniques, consists of measuring the optical radiation intensity, for example, the light inside a resonator.

An example of such case is shown in FIG. 17(a) which illustrates when the optical medium 1 comprises the optical circuit 30 comprising, as optical elements $EO_1$-$EO_N$, a cascade of directly coupled optical resonators Ris1-RisN. In such a plurality of resonators, an input resonator Ris1 is provided with an input IN for the optical radiation, and an output resonator RisN is provided with an output OUT for the output radiation. The resonators of the plurality of resonators Ris1-RisN can be, for example, ring resonators, analogous to resonator 310 in FIG. 15(b).

FIG. 17(c) schematically shows an embodiment example of the first ring resonator Rs1 comprising (besides the first and second dividers 312 and 314 which are not shown) also an optical actuator 323 which is based on thermal or electro-optical effects for modifying the resonance frequency of first ring resonator Rs1. Optical actuator 323 is controlled by a control circuit 324 connected to the electronic block 200.

Coupled resonators Ris1-RisN can be used in optics in a great variety of applications, among them: Wavelength Division Multiplexing (WDM) filters, delay lines (fixed and adjustable), wavelength conversion devices, and devices for generating single photons in the quantistic optics. In these structures, it is required that the optical cavities resonate at defined frequencies. For example, for the optical filters, all the resonators must exactly share the same resonance frequency.

FIG. 17(b) shows the trend, as a function of the normalized frequency fn=(f−fr)/FSR, of the transmittance of an optical circuit 30 comprising a filter with four ring resonators Ris1-Ris4 in case of correctly aligned resonating frequencies (curve G, solid line) and in case of a random deviation (having a standard deviation of FSR/5) of the resonance frequency of each ring (curve J, dashed line).

Due to the misalignment of the resonances, both the band pass zone and the cutoff out-of-band zone are strongly affected. The resonance frequencies of resonators Rs1-RsN can be adjusted by locally modifying the optical material of each resonator by a corresponding optical actuator 323 (see FIG. 17(c)).

It is observed that in a coupled resonators structure of the conventional type it is not possible to individually read the resonance frequency of each ring from the measurements at the input and output ports of the optical circuits, and consequently the actuators controlling the resonance frequency cannot be effectively controlled.

As said before with reference to the first and second resonators 300, 310, also the detecting system 100 comprising as optical medium 1 the optical circuit 30 of FIG. 17(a), enables to detect the resonance condition of a resonator from the optical power level inside the resonator itself, therefore independently from the presence of side resonators coupled to other optical devices.

Therefore, the condition of each ring resonator Rs1-RsN is determined by measurements of impedance variation obtained by a corresponding pair of electrodes $E_c$ and by the electric circuit 200. Thanks to such evaluation of the resonators Rs1-RsN condition, control circuit 324 can supply a feedback signal $S_{feed}$ to the optical actuator 323 by controlling the resonance frequency of one or more resonators Rs1-RsN.

It is observed the adjustment of the operative modes of an optical element by an actuator is not limited to the case of structures having coupled resonators but can be extended to any other type of optical element $OE_1$-$OE_N$ of the optical circuit 30 in FIG. 14.

In this way, the correct behavior of each optical element $OE_1$-$OE_N$ and of optical circuit 30 of the detecting system 100 can be automatically and adaptively modified to compensate the manufacturing tolerance effects, the environmental fluctuations, the aging of the components, and more generally all those factors degradating the performances of the circuit itself.

Optical Circuit Having a Differential Configuration

FIG. 18 shows an embodiment of detecting system 100, wherein optical medium 1 comprises an interferometer 60 including a first optical branch 325 and a second optical branch 326, made, for example, by corresponding integrated optical waveguides. First optical branch 325 is provided with an input 327 for an input optical radiation having intensity $I_{in}$ and further is optically coupled to second optical branch 326 in order to form a first optical divider DIV1 and a second optical divider DIV2, spaced from first optical divider DIV1.

Second divider DIV2 is optically coupled also to a first output segment 328 of first optical branch 325 and to a second output segment 329 of second optical branch 326. First output segment 328 is electrically coupled to a first upper electrode 2U and to a second upper electrode 3U, analogous to the previously described first and second electrodes 2, 3. First output segment 328 is provided with an output port Out1 for the optical radiation.

Second output segment 329 is electrically coupled to a first lower electrode 2D and to a second lower electrode 3D, analogous to the previously described first and second electrodes 2, 3. Second output segment 329 is provided with an output port Out2 for the optical radiation. Interferometer 60 enables to divide the intensity $I_{in}$ of the input radiation towards the two output ports Out1 and Out2, by an intensity respectively equal to $I_{out1}$ and $I_{out2}$.

According to an example, second upper electrode 3U and second lower electrode 3D are connected to the electric power generator 4. First upper electrode 2U and second upper electrode 2D are connected to measuring circuit 50.

Measuring circuit 50, analogous to the one previously described, is such to measure impedance variations (or of another electric parameter) associated to the optical power variations in first output segment 328 and is such to supply at the output a first measuring signal $S_{M1}$. Moreover, measuring circuit 50 is such to measure also the impedance variations (or of another electric parameter) associated to the optical power variations in second output segment 329 and such to supply at the output a second measuring signal $S_{M2}$.

Assuming first and second power dividers DIV1 and DIV2 are 3 dB dividers, the dividing ratio of the intensity of the field at the two output ports is given by:

$$K = \frac{I_{out2}}{I_{out1} + I_{out2}} = \sin^2\left(\frac{\Delta\phi}{2}\right) \qquad (6)$$

wherein $\Delta\phi=2\pi f\,(n_{\mathit{eff}1}\,L_1-n_{\mathit{eff}2}\,L_2)/c$ is the phase difference between the electrical fields propagating along the first optical branch 325 and second optical branch 326 of interferometer 60, effective refraction indexes $n_{\mathit{eff}1}$ and $n_{\mathit{eff}2}$, and geometric lengths $L_1$ and $L_2$ in the segments of first and second optical branches 325, 326 being comprised between the first DIV1 and second power divider DIV2.

According to equation (6), ratio K can be varied by controlling the geometric length or the effective refraction index of the optical materials of the two interferometer 60 branches.

First and second measuring signals $S_{M1}$, $S_{M2}$, representative of intensities $I_{out1}$ and $I_{out2}$, are supplied to corresponding inputs of a comparator 330, such as an operational amplifier employing a differential amplifier. Comparator 330 therefore generates a difference signal $S_A$ proportional to the intensities $I_{out1}$ and $I_{out2}$ difference, that is proportional to the degree of unbalance in the interferometer 60.

Figure 17:
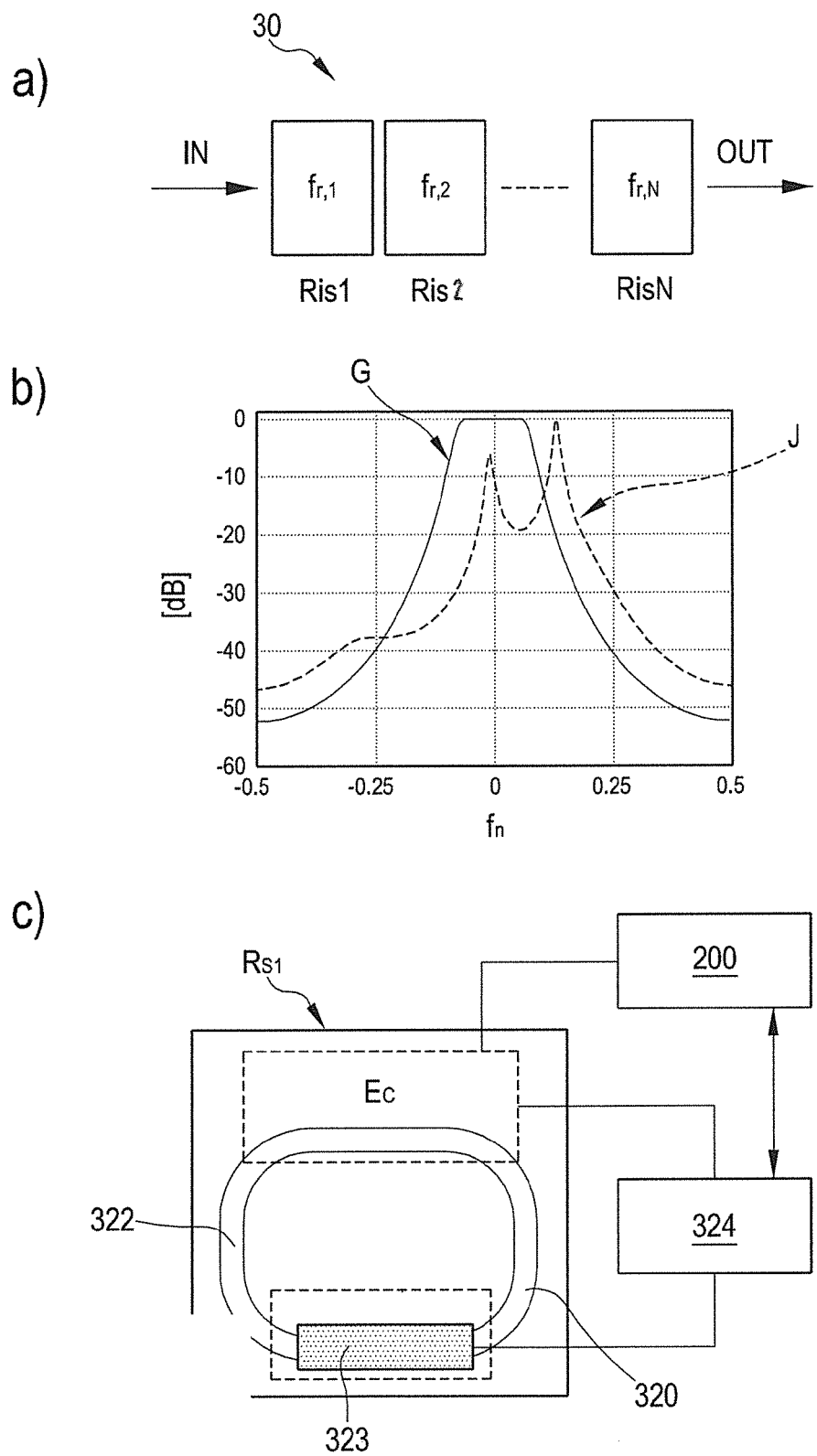
FIG. 17(a) shows an example of an optical medium comprising an optical resonators\ cascade.
FIG. 17(b) shows the trend of the transmittance of said optical resonator cascade, as a function of the normalized frequency.
FIG. 17(c) schematically shows an example of an embodiment of a ring resonator provided with an optical actuator.

In a segment of first optical branch 325, comprised between first and second dividers DIV1, DIV2, it is positioned an upper actuator 323U, analogous to the above cited actuator 323 of FIG. 17. In a segment of second optical branch 326, comprised between first and second dividers DIV1, DIV2, it is positioned a lower actuator 323D, analogous to the above mentioned actuator 323 of FIG. 17. First and second actuators 323U, 323D are controlled by the control circuit 324. First and second optical branches 325, 326 form delay lines for the optical radiation, having a corresponding delay adjustable by the first and second actuators 323U, 323D. Difference signal $S_A$ can be used by control circuit 324 for piloting first and second optical actuators 323U, 323D, in order to vary and set the balance degree of interferometer 60 or for dynamically modifying the operative point for any desired value of K.

It is observed the use of a comparator 330, and therefore of the differential configuration, is not limited to the specific case of the Mach-Zehnder type interferometer 60, but such configuration can be applied for measuring the light intensity difference between two generic points in a generic optical medium.

Optical Coupling Fiber-guide

According to another embodiment of the detecting system 100, this can be applied to the coupling of the light from a fiber to an optical guide, and vice versa.

According to the conventional technique, the light exiting the fiber is coupled to an optical guide by positioning the end of the fiber in front of the end of the guide, which is positioned on the facet of the optical chip. The relative position of the fiber with respect to the chip facet is optimized in order to ensure the greatest overlapping between the guided mode in the fiber and the propagating mode of the optical guide, in order to ensure in this way the greatest injection of light in the guide.

For optimizing the position of the input fiber, the amount of light coupled in the guide must be known, and therefore must be measured. To this end, the conventional procedure requires the use of a second optical fiber to collect the light exiting the guide, positioned in proximity of the guide end. Light exiting the guide is then measured by a photodiode or by a conventional photo detector downstream the output optical fiber. This procedure has two main disadvantages:

1) two optical fibers must be simultaneously aligned, in order to ensure the coupling at the input and at the output, that is towards and from the guide, respectively. This makes burdensome the procedure in terms of time and difficult to implement by automatic algorithms. In fact, positioning two fibers implies the maximization of a non necessarily convex cost function having six spatial degrees of freedom (position [x, y, z] of each fiber end with respect to the guide ends), which generally has different relative maximums, which make prohibitive the convergence towards an absolute value.

2) Since the light collected by the output fiber propagates through the entire optical chip, the properties of the optical field at the cross-section of the output facet can be substantially different from the ones of the field at the cross-section of the input facet, and generally are not already known. For example, if the optical guide is used for forming a complex optical circuit, the amplitude and spectrum of the light transmitted through the circuit, can be strongly modified. Therefore, it is not possible to define/establish a desired coupling efficiency with algorithms which are used by automatic aligning systems.

FIG. 19(a) shows the detecting system 100 used for optically coupling an optical fiber 400 with a fourteenth waveguide WG14, which can be one of the previously described waveguides.

Analogously to what has been previously described, to fourteenth waveguide WG14 are applied the first and second electrodes 2, 3 in order to form a corresponding pair of electrodes $E_{c1}$ in turn connected to the electric power generator 4 and to measuring circuit 50 and therefore to the probe electric block 200.

Since detecting system 100 enables to evaluate the light propagating in fourteenth waveguide WG14, measuring electric signal $S_M$ supplied by measuring circuit 50 can be used for piloting an aligning actuator 401, by only controlling the position of fiber 400 in order to maximize the coupling efficiency. Aligning actuator 401 can comprise stepper motors or piezo-actuators.

In this way, the alignment of each fiber can be individually made without the necessity of an auxiliary optical fiber to be simultaneously aligned at the end of the guide. Further, the electrodes pair $E_{c1}$ can be advantageously positioned near the output end of fourteenth waveguide WG14, so that the intensity of the propagating light is not affected by any optical circuit present between the input facet and the electrodes themselves.

The coupling between an optical fiber and a waveguide can also be formed by an optical grating, or by other well known coupling systems such as for example prisms or photonic crystal structures. Coupling gratings are well known and widely used devices for injecting light inside one guide. The relative position and the angle of the fiber to the coupling grating are optimized in order to ensure the greatest power transfer from the fiber to the guide. According to conventional techniques, in order to optimize the input fiber position and angle, the light amount coupled in the guide must be collected and measured by a second optical fiber positioned in proximity of a second coupling grating at the output end of the guide. This procedure, which requires a simultaneous alignment of two optical fibers, has the same disadvantage of the above mentioned coupling.

As shown in FIG. 19(b), detecting system 100 can be used for coupling fiber 400 with fourteenth waveguide WG14 provided with the optical grating 402. In this way, the alignment of each fiber can be individually done, without requiring an auxiliary fiber simultaneously aligned with another end of the guide.

Optical Wafers Test

Figure 20:
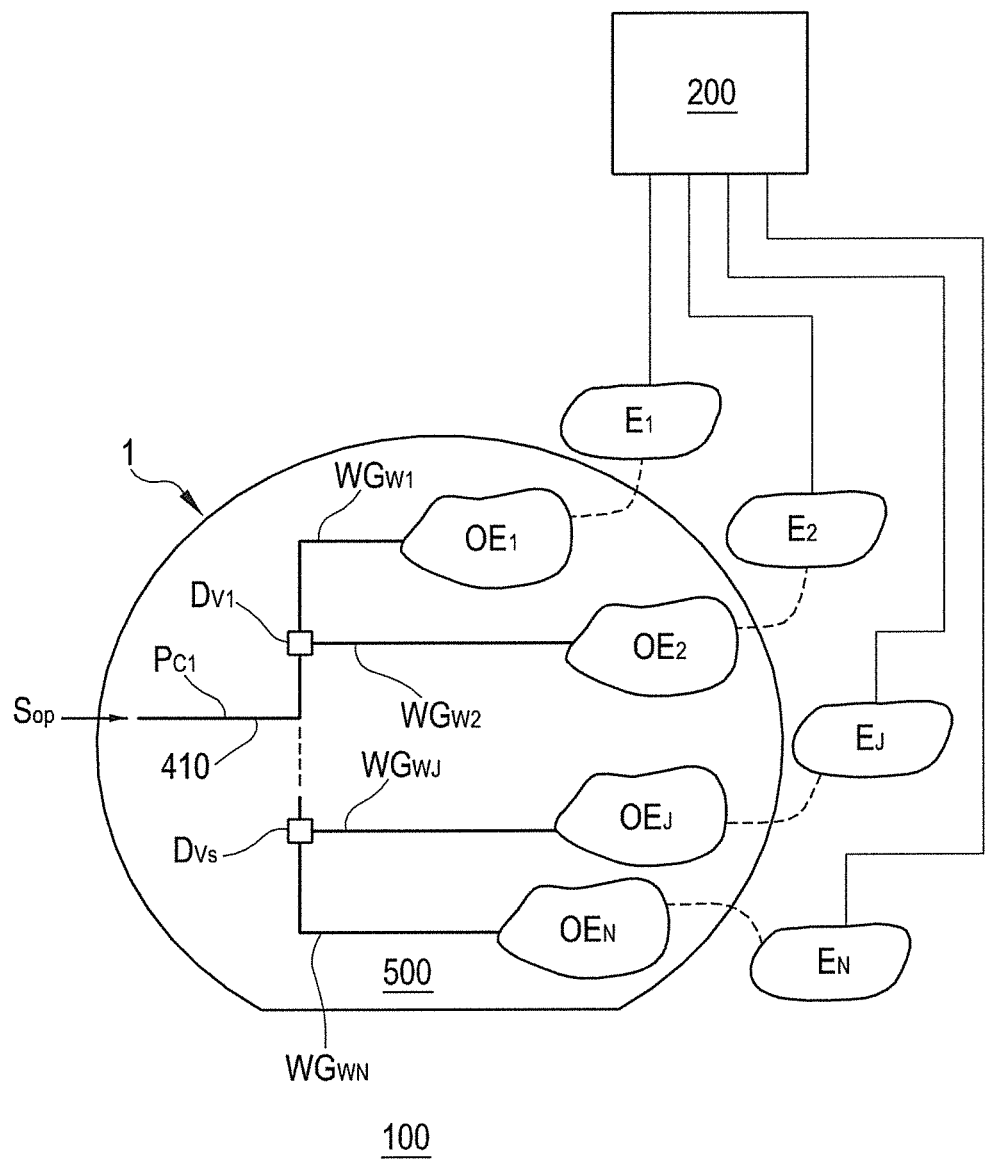
FIG. 20 shows another example of the detecting system structured to perform test measurements on a wafer on which optical components are integrated.

According to a further embodiment of the detecting system 100, outlined in FIG. 20, optical medium 1 is a wafer 500 on which optical components $OE_1$-$OE_N$ are integrated. Optical wafer 500 is provided with a corresponding first input port $P_{i1}$ for the optical radiation $S_{op}$ which is optically coupled to an input integrated waveguide 410. Input integrated waveguide 410 is, in turn, coupled by a plurality of power optical dividers $Dv_1$-$Dv_s$ to a plurality of integrated waveguides $WG_{w1}$-$WG_{wN}$, each coupled to one of the optical components $OE_1$-$OE_N$. Integrated waveguides $WG_{w1}$-$WG_{wN}$ and/or optical components $OE_1$-$OE_N$ can be waveguides of the previously described type, can comprise further optical devices such as, for example, the described resonators or other types of optical components.

The wafer test enables to characterize the process of manufacturing the entire wafer 500 without the necessity of dividing and cutting it into chips and forming a package. According to the arrangement in FIG. 20, input radiation $S_{op}$ produced by an optical source, is coupled to the input guide 410 and then is divided on the waveguides $WG_{w1}$-$WG_{wN}$ by the optical power dividers $Dv_1$-$Dv_N$.

The test of wafer 500 can be performed by the use of a single optical input, that is the input port ($P_{j1}$), and the optical power of the optical components $OE_1$-$OE_N$ is evaluated by electrodes $E_1$-$E_N$ and control block 200, as already described above.

The embodiments described with reference to FIGS. 1-20, have several advantages, among which:
  the described detecting technique is not invasive since it introduces neither additional optical losses nor spurious (undesired) modulations of amplitude, phase, frequency of polarization (or combinations thereof) in the optical signal.
  The described technique can be local since the size of the detecting area can be reduced to a few tens of μm² (miniaturization).
  The described technique can be multi-site and can be easily parallelized in a potentially unlimited number of detecting sites (the limitations are given at a system level for the arrangement of the electric contacts and electrodes). Multiplexing and integrated electronics techniques ensure hundreds or thousands of detecting areas.
  The described technique can be integrated in anyone optical system without additional manufacturing steps (that is without additional process costs) and without the necessity of modifying the optical level (independent project), since the metal electrodes are independent from the underlying levels, and are very often already present in the devices manufacturing process, for example for implementing thermal actuators or thermal-controllers.
  The alignment of the reading electrodes with the underlying guides is not particularly important, and the aligning tolerances are completely compatible with any manufacturing technology, also with the less recent ones having accuracies only in the order of a few micrometers.
  The described technique adapts to any manufacturing technology, any materials, and particularly to the semi-conductors, such as for example silicon and indium phosphide.
  The described technique is compatible with the CMOS manufacturing processes since the electric signal detecting circuits can be easily implemented by a standard CMOS micro technology. The primary advantage is the direct monolithic integration of the detecting device with silicon photonic systems. Further advantages comprise the possibility of implementing miniaturized systems (chips of few millimeters) for detecting light, and therefore extremely portable objects and potentially having a low cost (adapted to a mass production).
  The described technique enables to perform a wafer level test.

The invention claimed is:

1. An optical radiation detection system, comprising:
   an optical medium structured to define an optical region adapted to transmit the optical radiation and being associated with at least one electrical parameter varying in accordance with the optical radiation concerning said optical region;
   a first electrode and a second electrode electrically coupled to the optical medium; wherein at least one of said first and second electrodes is capacitively coupled to the optical medium and is spaced from said optical region by a dielectric material,
   an electric current or voltage generator connected to said first electrode and structured to provide an electric signal to be applied to the optical medium;
   an electric measuring circuit connected to said second electrode and structured to provide an electric measuring signal representing a variation of said at least one electric parameter of said optical region,
   wherein the first electrode is capacitively coupled to said to the optical medium and is spaced from the optical region by a distance chosen so as to substantially reduce a disturbance in amplitude, phase, frequency and polarization of the optical radiation due to said first electrode,
   wherein said distance is chosen so that an amplitude value of the electric field E(d) associated with the optical radiation which acts on said first electrode is lower than a maximum amplitude value of the electric field $E_0$ associated to the optical radiation which acts in said region according to the decibel relationship: $R=|E_0/E(d)|^2>10$ dB, preferably, R is higher than 20 dB, more preferably R is higher than 30 dB and most preferably R is higher than 40 dB.

2. The detection system according to claim 1, wherein said optical medium comprises at least one of the following optical devices: waveguide, integrated waveguide, ridge integrated waveguide, rib integrated waveguide, channel waveguide, guide made using the photonic crystal technology, slot guide, guide obtained through diffusion processes, guides obtained through titanium spread in a lithium niobate crystal, semiconductor technology waveguide, silicon on insulator platform technology waveguide, indium phosphide technology waveguide, optical fibre, lithium niobate optical device, amorphous silicon optical device, AlGaAS optical device and combinations thereof with other materials, in particular those of group III-V (for example, InP), Germanium and combinations thereof with other materials, in particular those of group IV (for example Si), optical resonator, Fabry-Pérot resonator, ring resonator, a plurality of optically coupled resonators, optical interferometer, Mach-Zehnder interferometer, a wafer integrated optical circuit.

3. The detection system according to claim 1, wherein said at least one electric parameter is related to or is at least one of the following electric quantities: an electrical resistance associated to the optical medium, an electrical capacitance associated to the optical medium, an electrical impedance associated to the optical medium, an electric voltage associated to the optical medium, an electric current associated to the optical medium, an electrical admittance associated to the optical medium.

4. The detection system according to claim 1, wherein said first electrode and the electric signal to be applied to the optical medium are such that a ratio between a first power of an unwished disturbance optical signal due to said electric signal and a second average power of the optical radiation, measured after a propagation through said region is lower than −20 dB, preferably lower than −30 dB, more preferably lower than −40 dB, most preferably lower than −50 dB.

5. The detection system according to claim 1, wherein the system is structured for measuring said measuring electric signal representative of a change in said at least one electric parameter depending on the optical radiation within the scope of the following applications: optical survey for measuring the amount of the optical radiation in said region, evaluating the resonance conditions of resonators, positioning for the optical fibre-guide coupling, optical wafer tests.

6. The detection system according to claim 1, further comprising an actuator device connected to said measuring circuit and configured to change operational characteristics of the optical medium in accordance with said measuring signal.

7. The detection system according to claim 1, wherein:
the optical medium comprises at least a further optical region adapted for transmitting the optical radiation and being associated with at least one corresponding electrical parameter varying in accordance with the optical radiation concerning the respective optical region;
the system further comprising: at least one further electrode coupled to said at least a further optical region and connected to said electric measuring circuit.

8. The detection system according to claim 1, wherein the first and second electrode are associated with parasitic components and the electric measuring circuit is configured to extract said electric parameter independently from the parasitic components.

9. The detection system according to claim 1, wherein said second electrode is capacitively or resistively coupled to the optical medium.

10. The detection system according to claim 9, wherein:
said electric current or voltage generator is such that the electric signal shows a frequency allowing said electric signal to be coupled to the optical medium;
said measuring circuit is structured so as to adopt one of the following measuring techniques: current detection by synchronous detection (lock-in), techniques based on half-bridge, techniques based on bridge circuits in the raziometric splitter configuration, techniques based on full-bridge circuits, techniques based on Wheatstone bridge, techniques based on the Fast Fourier Transform, FFT, Fourier Transform, resonating techniques.

11. An optical radiation detection system, comprising:
an optical medium structured to define an optical region adapted to transmit the optical radiation and being associated with at least one electrical parameter varying in accordance with the optical radiation concerning said optical region;

a first electrode and a second electrode electrically coupled to the optical medium; wherein at least one of said first and second electrodes is capacitively coupled to the optical medium and is spaced from said optical region by a dielectric material, an electric current or voltage generator connected to said first electrode and structured to provide an electric signal to be applied to the optical medium;

an electric measuring circuit connected to said second electrode and structured to provide an electric measuring signal representing a variation of said at least one electric parameter of said optical region, wherein:

the optical medium comprises an interferometer and includes: a first optical branch and a second optical branch provided with respective inputs and outputs for optical radiations;

the electric measuring circuit is connected to the second electrode which is coupled to an output of the first branch and to a further second electrode which is connected to a further output of the second branch; the electric measuring circuit being structured to provide a first electric measuring signal and a second electric measuring signal, each representing electric parameter variations associated to the first branch and the second branch, respectively;

the system further comprises a differential module structured to provide a differential signal from first electric measuring signal and a second electric measuring signal.

* * * * *